(12) United States Patent
Dong et al.

(10) Patent No.: US 12,439,693 B2
(45) Date of Patent: Oct. 7, 2025

(54) DISPLAY PANEL AND MANUFACTURING METHOD THEREOF, AND DISPLAY DEVICE

(71) Applicant: WUHAN TIANMA MICRO-ELECTRONICS CO., LTD., Wuhan (CN)

(72) Inventors: Bo Dong, Wuhan (CN); Dongliang Dun, Wuhan (CN)

(73) Assignee: WuHan TianMa Micro-electronics Co., Ltd., Wuhan (CN)

( * ) Notice: Subject to any disclaimer, the term of this patent is extended or adjusted under 35 U.S.C. 154(b) by 429 days.

(21) Appl. No.: 18/194,832

(22) Filed: Apr. 3, 2023

(65) Prior Publication Data

US 2023/0238395 A1 Jul. 27, 2023

(30) Foreign Application Priority Data

Dec. 15, 2022 (CN) .......................... 202211617847.5

(51) Int. Cl.
*H10D 86/60* (2025.01)
*G09G 3/32* (2016.01)
(Continued)

(52) U.S. Cl.
CPC ............. *H10D 86/60* (2025.01); *H01L 22/20* (2013.01); *H10D 86/021* (2025.01); *H10D 86/441* (2025.01)

(58) Field of Classification Search
CPC .... H10D 86/60; H10D 86/021; H10D 86/441; H10D 86/481; H01L 22/20;
(Continued)

(56) References Cited

U.S. PATENT DOCUMENTS

2015/0378486 A1* 12/2015 Yu ........................ G06F 3/04164
427/79
2021/0151483 A1* 5/2021 Feng ...................... H10K 59/35
(Continued)

FOREIGN PATENT DOCUMENTS

| CN | 105404428 A | 3/2016 |
| CN | 110867478 B | 1/2022 |

OTHER PUBLICATIONS

Office Action mailed May 1, 2025; issued in corresponding Chinese Application No. 202211617847.5; filed Dec. 15, 2022, 19 pages.

*Primary Examiner* — Pegeman Karimi
(74) *Attorney, Agent, or Firm* — CHRISTENSEN O'CONNOR JOHNSON KINDNESS PLLC

(57) ABSTRACT

A display panel and manufacturing method thereof, and a display device. The display region includes first wire and second wire. The non-display region includes third wire and fourth wire. The first wire includes first-type first wire, first-type first wire including first sub wire and second sub wire spaced apart between third wire and fourth wire. The second wire includes first-type second wire; third wire includes first repair line. The fourth wire includes second repair line, and the first sub wire and second sub wire are electrically connected to second repair line through first repair line and first-type second wire. The first wire includes second-type first wire, and second-type first wire is continuous between third wire and fourth wire; second wire includes second-type second wire, second-type second wire transmitting first common signal.

19 Claims, 17 Drawing Sheets

(51) Int. Cl.
*H01L 21/66* (2006.01)
*H10D 86/01* (2025.01)
*H10D 86/40* (2025.01)

(58) Field of Classification Search
CPC ......... G09G 3/3233; G09G 2300/0413; G09G 2300/0819; G09G 2300/0842; G09G 2300/0861; G09G 2310/0251; G09G 2330/08; G09G 2330/10; H10K 59/131; H10K 71/861
See application file for complete search history.

(56) References Cited

U.S. PATENT DOCUMENTS

2022/0172670 A1\* 6/2022 Shin .................. G09G 3/006
2022/0199739 A1\* 6/2022 Du ..................... H10D 86/00

\* cited by examiner

US 12,439,693 B2

DISPLAY PANEL AND MANUFACTURING METHOD THEREOF, AND DISPLAY DEVICE

CROSS-REFERENCE TO RELATED APPLICATIONS

The present application claims priority to Chinese Patent Application No. 202211617847.5, filed on Dec. 15, 2022, the content of which is incorporated herein by reference in its entirety.

TECHNICAL FIELD

The present disclosure relates to the technical field of display, and in particularly, to a display panel and a manufacturing method thereof, and a display device.

BACKGROUND

With continuous development of a display technology, consumers' requirements for display screens are constantly increasing. At present, various types of displays, including liquid crystal display screens and organic light-emitting display screens, emerge one after another and have developed rapidly. On this basis, display technologies such as 3D display, a touch display technology, curved surface display, ultra-high resolution display, and anti-peep display are constantly emerging.

However, current display panels have problems that affect display quality, such as poor brightness uniformity and/or easy disconnection of signal lines.

SUMMARY

In a first aspect, some embodiments of the present disclosure provide a display panel, having a display region and a non-display region.

In some embodiments, the display region includes first wires and second wires located in the display region; at least one third wire and at least one fourth wire located in the non-display region, and along extension directions of the first wires, the third wire and the fourth wire are located on two sides of the first wires respectively. In some embodiments, the first wires includes a first-type first wire, and the first-type first wire includes a first sub wire and a second sub wire spaced apart between one of the at least one third wire and one of the at least one fourth wire; the second wires includes a first-type second wire; the one of the at least one third wire includes a first repair line; the one of the at least one fourth wire includes a second repair line; and the first sub wire and the second sub wire are electrically connected to each other through the second repair line, the first repair line and the first-type second wire.

In some embodiments, the first wires includes a second-type first wire, and the second-type first wire is continuous between one of the at least one third wire and one of the at least one fourth wire; the second wires includes a second-type second wire, and the second-type second wire transmits a first common signal.

In a second aspect, some embodiments of the present disclosure provide a method for manufacturing a display panel, and the display panel includes a display region and a non-display region.

In some embodiments, the method includes forming first wires and second wires in the display region.

In some embodiments, the method includes forming at least one third wire and at least one fourth wire in the non-display region, along extension directions of the first wires, the third wire and the fourth wire are located on two sides of the first wires respectively.

In some embodiments, the method includes detecting whether a first-type first wire exists in the first wires, the first-type first wire includes a first sub wire and a second sub wire spaced apart between one of the at least one third wire and one of the at least one fourth wire.

In some embodiments, the first wires include the first-type first wire.

In some embodiments, when the first wires include the first-type first wire, the method further includes selecting one of the second wires as a first-type second wire; and cutting the at least one third wire to obtain a first repair line, and cutting the at least one fourth wire to obtain a second repair line.

In some embodiments, the method includes causing the first sub wire and the second sub wire to be electrically connected through the first repair line, the first-type second wire, and the second repair line.

In a third aspect, some embodiments of the present disclosure provide a display device, includes the above display panel.

BRIEF DESCRIPTION OF DRAWINGS

In order to more clearly illustrate the technical solutions in the embodiments of the present disclosure, the accompanying drawings used in the description of the embodiments will be briefly introduced below. It is apparent that, the accompanying drawings in the following description are only some embodiments of the present disclosure, and other drawings can be obtained by those of ordinary skill in the art from the provided drawings without creative efforts.

DESCRIPTION OF EMBODIMENTS

In order to better understand the technical solutions of the present disclosure, the embodiments of the present disclosure will be described in detail below with reference to the accompanying drawings.

It should be made clear that the described embodiments are merely some of rather than all of the embodiments of the present disclosure. All other embodiments acquired by those of ordinary skill in the art without creative efforts based on the embodiments in the present disclosure fall within the protection scope of the present disclosure.

The terms used in the embodiments of the present disclosure are for the purpose of describing particular embodiments only, and are not intended to limit the present disclosure. As used in the embodiments of the present disclosure and the appended claims, the singular forms of "a/an", "the", and "said" are intended to include plural forms, unless otherwise clearly specified in the context.

It should be understood that the term "and/or" used herein is merely an association relationship describing associated objects, indicating that three relationships may exist. For example, A and/or B indicates that there are three cases of A alone, A and B together, and B alone. In addition, the character "/" herein generally means that associated objects before and after it are in an "or" relationship.

It should be understood that, although the terms such as "first", "second", and "third" may be used to describe wires in some embodiments of the present disclosure, the wires should not be limited to the terms. The terms are only used to distinguish the wires from one another. For example, without departing from the scope of the embodiments of the present disclosure, the first wire may also be called the second wire, and similarly, the second wire may also be called the first wire.

Figure 1:
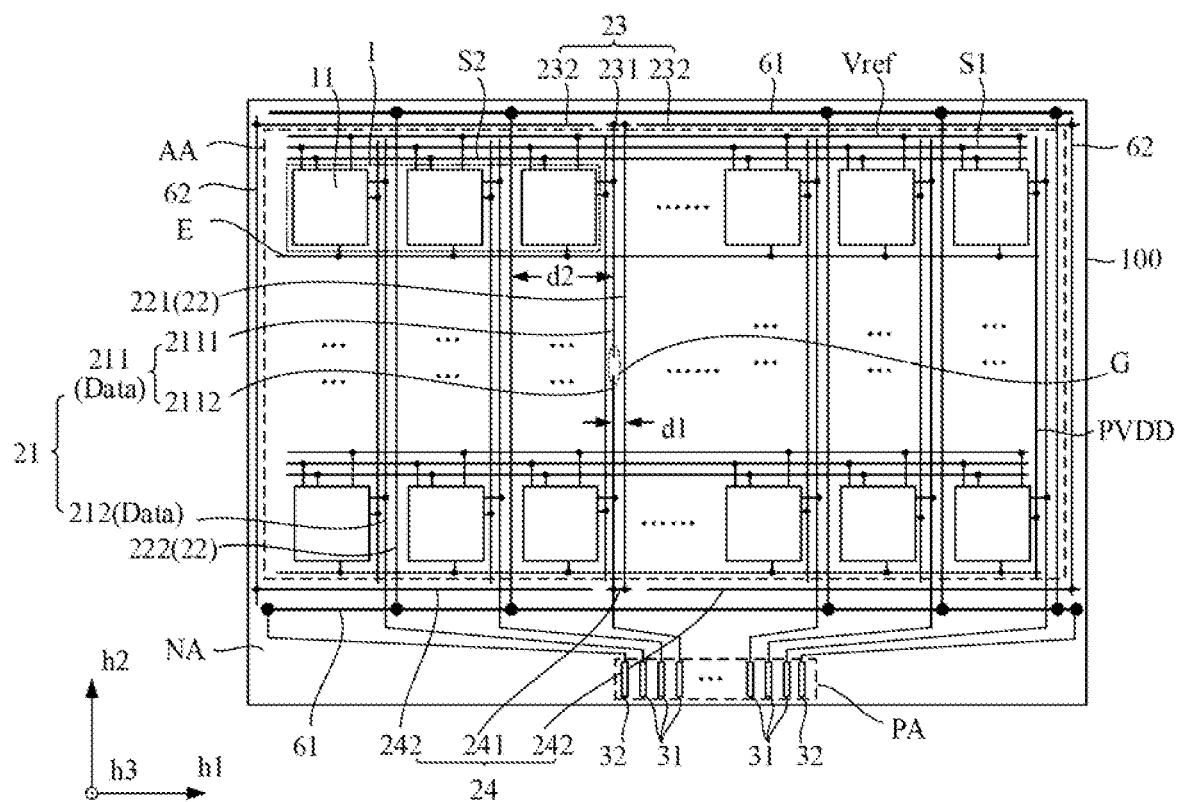
FIG. 1 is a schematic diagram of a display panel according to some embodiments of the present disclosure.

Some embodiments of the present disclosure provide a display panel. FIG. 1 is a schematic diagram of a display panel according to some embodiments of the present disclosure. As shown in FIG. 1, the display panel 100 includes a display region AA and a non-display region NA. The display region AA includes pixel units 1. The pixel units 1 include sub-pixels. The sub-pixels include a pixel driving circuit 11 and a light-emitting element (not shown in FIG. 1) electrically connected.

Figure 2:
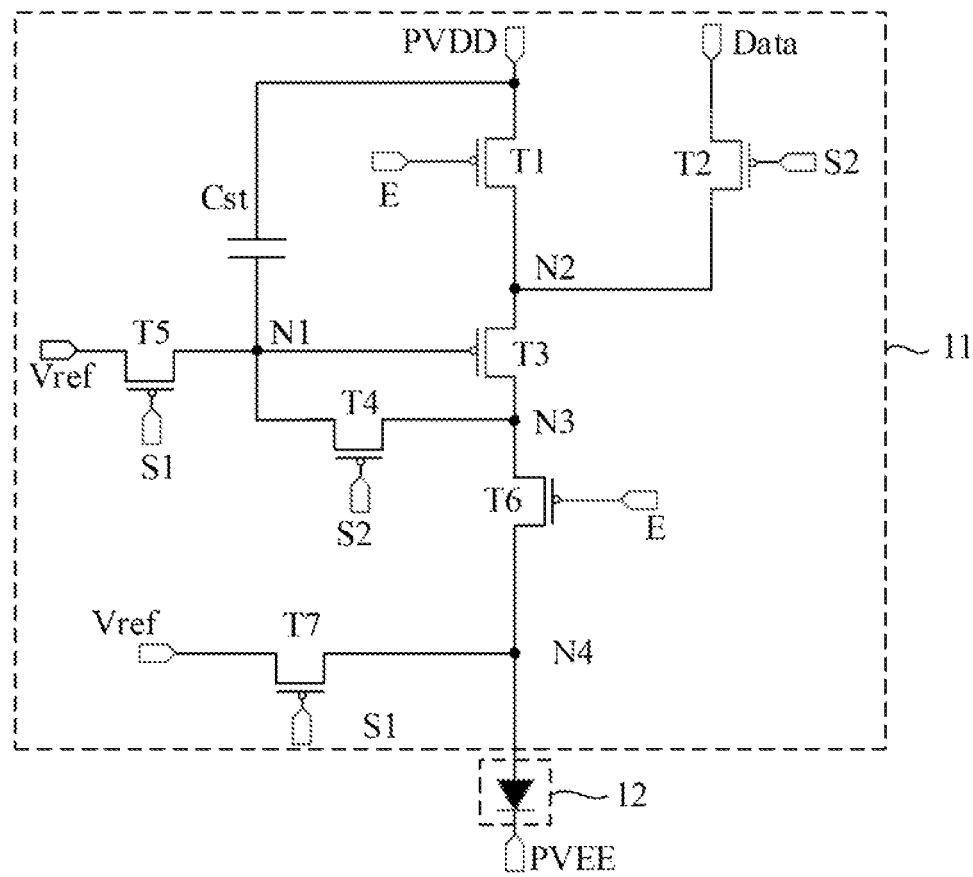
FIG. 2 is a schematic diagram of a sub-pixel equivalent circuit according to some embodiments of the present disclosure.

FIG. 2 is a schematic diagram of a sub-pixel equivalent circuit according to some embodiments of the present disclosure. As shown in FIG. 2, the pixel driving circuit 11 includes a first transistor T1, a second transistor T2, a third transistor T3, a fourth transistor T4, a fifth transistor T5, a sixth transistor T6, a seventh transistor T7, and a storage capacitor C. In some embodiments, the fourth transistor T4, the fifth transistor T5, or the seventh transistor T7 may be a double-gate transistor. The fifth transistor T5 and the seventh transistor T7 may be electrically connected to a same reference voltage signal line to receive a same reference voltage, or may be electrically connected to different reference voltage signal lines to receive different reference voltages.

As shown in FIG. 1, the display region AA further includes a first scanning line S1, a second scanning line S2, a light-emission control signal line E, a data line Data, a first power supply voltage line PVDD, a second power supply voltage line (not shown in FIG. 1), and a reference voltage signal line $V_{ref}$.

Referring to FIG. 2, a control terminal of the third transistor T3 is electrically connected to a first node N1, a first terminal of the third transistor T3 is electrically connected to a second node N2, and a second terminal of the third transistor T3 is electrically connected to a third node N3. A control terminal of the first transistor T1 is electrically connected to the light-emission control signal line E, and a first terminal of the first transistor T1 is electrically connected to the first power supply voltage line PVDD. A control terminal of the second transistor T2 is electrically connected to the second scanning line S2, and a first terminal of the second transistor T2 is electrically connected to the data line Data. Both a second terminal of the first transistor T1 and a second terminal of the second transistor T2 are electrically connected to the second node N2. A control terminal of the fourth transistor T4 is electrically connected to the second scanning line S2. A first terminal of the fourth transistor T4 is electrically connected to the third node N3, and a second terminal of the fourth transistor T4 is electrically connected to the first node N1. A control terminal of the fifth transistor T5 is electrically connected to the first scanning line S1. A first terminal of the fifth transistor T5 is electrically connected to the reference voltage signal line Vref. A second terminal of the fifth transistor T5 is electrically connected to the first node N1. A control terminal of the sixth transistor T6 is electrically connected to the light-emission control signal line E, a first terminal of the sixth transistor T6 is electrically connected to the third node N3, and a second terminal of the sixth transistor T6 is electrically connected to a fourth node N4. A control terminal of the seventh transistor T7 is electrically connected to the second scanning line S2, and a first terminal of the seventh transistor T7 is electrically connected to the reference voltage signal line Vref. A second terminal of the seventh transistor T7 is electrically connected to the fourth node N4. The light-emitting element 12 has a first pole electrically connected to the fourth node N4 and a second pole electrically connected to the second power supply voltage line PVEE. A first polar plate of the storage capacitor C is electrically connected to the first power supply voltage line PVDD, and a second polar plate of the storage capacitor C is electrically connected to the first node N1.

Figure 3:
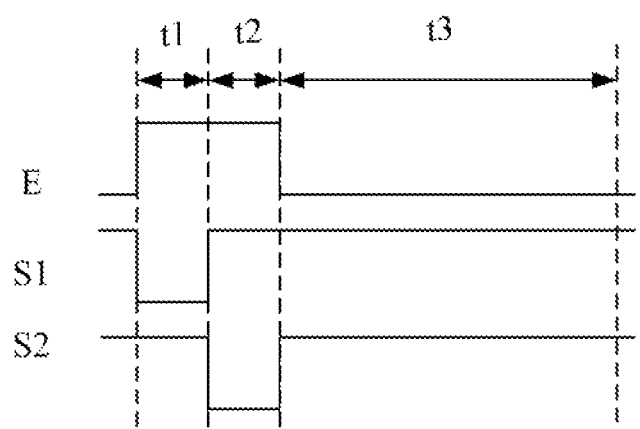
FIG. 3 is a schematic diagram of an operation sequence of a pixel driving circuit according to some embodiments of the present disclosure.

When the pixel driving circuit 11 operates, referring to FIG. 2 and FIG. 3 which is a schematic diagram of an operation sequence of a pixel driving circuit according to some embodiments of the present disclosure, an operation process of the pixel driving circuit includes a reset phase t1, a charging phase t2, and a light-emitting phase t3.

In the reset phase t1, the first scanning line S1 controls the fifth transistor T5 and the seventh transistor T7 to be turned on, and a reference voltage provided by the reference voltage signal line $V_{ref}$ resets the first node N1 and the fourth node N4 through the fifth transistor T5 and the seventh transistor T7 respectively.

In the charging phase t2, the second scanning line S2 controls the second transistor T2 and the fourth transistor T4 to be turned on, and a data voltage $V_{data}$ provided by the data line Data is written into the second node N2 through the second transistor T2. In the phase, the third transistor T3 is turned on. Potential of the first node N1 changes continuously until the potential $V_{N1}$ of the first node N1 changes to $V_{N1}=V_{data}-|V_{th}|$, where $V_{data}$ denotes the data voltage provided by the data line Data, and $V_{th}$ denotes a threshold voltage of the third transistor T3.

In the light-emitting phase t3, the first transistor T1, the sixth transistor T6, and the third transistor T3 are turned on, under the action of a first power supply voltage provided by the first power supply voltage line PVDD and a second power supply voltage provided by the second power supply voltage line PVEE, a current path between the first power supply voltage line PVDD and the second power supply voltage line PVEE is on, and the light-emitting element 12 electrically connected to the pixel driving circuit 11 is on.

In some embodiments, as shown in FIG. 1, the first scanning line S1, the second scanning line S2, and the light-emission control signal line E all extend along a first direction h1, and first scanning lines S1, second scanning lines S2, and light-emission control signal lines E are arranged along a second direction h2. One first scanning line S1 is electrically connected to pixel driving circuits 11 arranged along the first direction h1. One second scanning line S2 is electrically connected to the plurality of pixel driving circuits 11 arranged along the first direction h1. One light-emission control signal line E is electrically connected to the plurality of pixel driving circuits 11 arranged along the first direction h1. The data line Data extends along the second direction h2. A plurality of data lines Data are arranged along the first direction h1. One data line Data is electrically connected to pixel driving circuits 11 arranged along the second direction h2.

For example, in some embodiments of the present disclosure, the first power supply voltage, the second power supply voltage, and the reference voltage required by different pixel driving circuits 11 may be the same. That is, the first power supply voltage transferred by the first power supply voltage line PVDD, the second power supply voltage transferred by the second power supply voltage line PVEE, and the reference voltage transferred by the reference voltage signal line $V_{ref}$ may be a common signal shared by pixel driving circuits 11.

In some embodiments of the present disclosure, at least one of the first scanning line S1, the second scanning line S2, the light-emission control signal line E, and the data line Data includes a first wire. FIG. 1 is a schematic diagram in which the data line Data includes a first wire 21.

In some embodiments of the present disclosure, the first wire 21 includes a first-type first wire and/or a second-type first wire. FIG. 1 is a schematic diagram illustrating that a first-type first wire 211 and a second-type first wire 212 are arranged in the display region AA. The first-type first wire 211 includes a first sub wire 2111 and a second sub wire 2112 spaced apart. "Spaced apart" means that a gap G exists between the first sub wire 2111 and the second sub wire 2112. That is, the first sub wire 2111 and the second sub wire 2112 are disconnected at the gap, and a signal of one of the first sub wire 2111 and the second sub wire 2112 cannot be transmitted to the other at the gap. For example, the first-type first wire 211 may be an abnormal wire including a breakpoint in the first wire 211 caused by a process, and the gap between the first sub wire 2111 and the second sub wire 2112 may be the breakpoint caused by the process. The second-type first wire 212 is the first wire 21 that does not include a breakpoint in the display region AA, that is, continuously arranged.

As shown in FIG. 1, the display region AA further includes second wires 22. In some embodiments of the present disclosure, the second wire 22 includes a first-type second wire and/or a second-type second wire. FIG. 1 is a schematic diagram illustrating that a first-type second wire 221 and a second-type second wire 222 are arranged in the display region AA. For example, the first-type second wire 221 is electrically connected to the first-type first wire 211, and signals transmitted by the first-type second wire 221 and the first-type first wire 211 electrically connected to each other are the same. The second-type second wire 222 is configured to transmit a first common signal. The first common signal includes any one of the first power supply voltage, the second power supply voltage, and the reference voltage described above.

For example, still referring to FIG. 1, the non-display region NA includes at least one third wire 23 and at least one fourth wire 24. Along an extension direction of the first wire 21, the third wire 23 and the fourth wire 24 are located on two sides of the first wire 21 respectively. For the first-type first wire 211, the first sub wire 2111 and the second sub wire 2112 are spaced apart between the third wire 23 and the fourth wire 24. The second-type first wire 212 is continuous between the third wire 23 and the fourth wire 24.

As shown in FIG. 1, the third wire 23 includes a first repair line 231, and the fourth wire 24 includes a second repair line 241. The first sub wire 2111 and the second sub wire 2112 are electrically connected through the first repair line 231, the first-type second wire 221, and the second repair line 241. "Electrically connected" means that, after any one of the first sub wire 2111, the second sub wire 2112, the first repair line 231, the first-type second wire 221, and the second repair line 241 is connected to an electrical signal, the electrical signal may be transmitted to other traces in the above traces. That is, the electrical signal may form a current path among the first sub wire 2111, the second sub wire 2112, the first repair line 231, the first-type second wire 221, and the second repair line 241. For example, in some embodiments of the present disclosure, the first repair line 231 may be in contact with the first sub wire 2111 and the first-type second wire 221, and the second repair line 241 may be in contact with the second sub wire 2112 and the first-type second wire 221.

Figure 4:
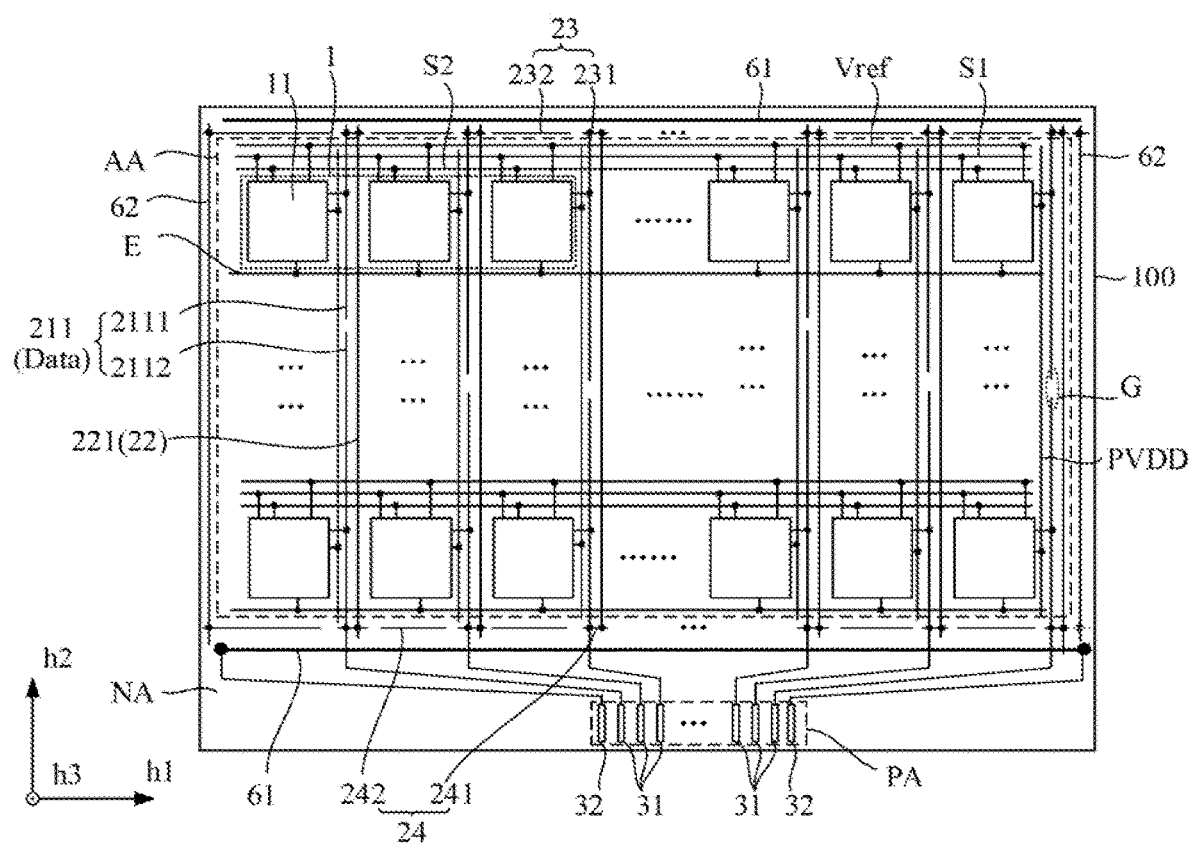
FIG. 4 is a schematic diagram of another display panel according to some embodiments of the present disclosure.

FIG. 4 is a schematic diagram of another display panel according to some embodiments of the present disclosure, for example, as shown in FIG. 4, it illustrates that the first wire 21 includes only the first-type first wire 211. For example, as shown in FIG. 4, each second wire 22 is the first-type second wire 221 electrically connected to the corresponding first-type first wire 211.

As shown in FIG. 4, the third wire 23 includes first repair lines 231. The plurality of first repair lines 231 are spaced apart. Different first repair lines 231 are electrically connected to different first sub wires 2111. The fourth wire 24 includes second repair lines 241. The plurality of second repair lines 241 are spaced apart. Different second repair lines 241 are electrically connected to different second sub wires 2112.

Figure 5:
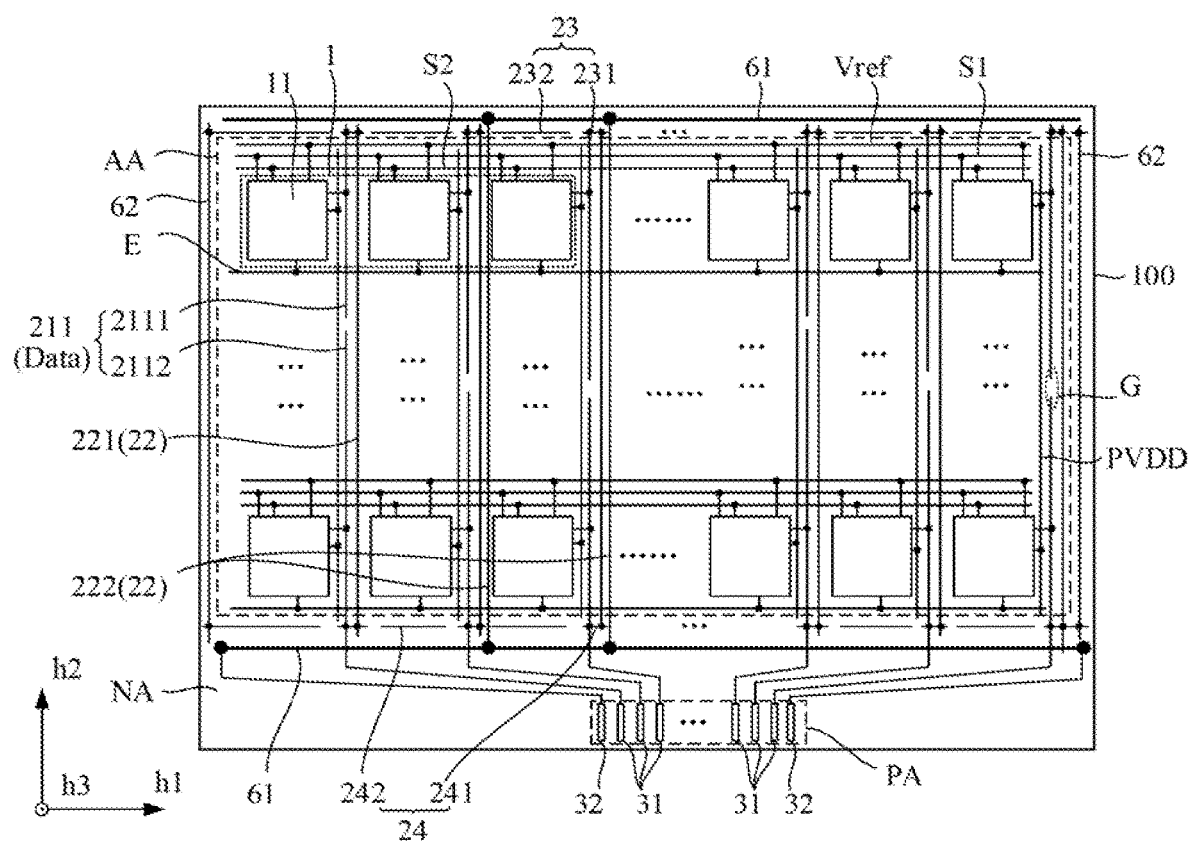
FIG. 5 is a schematic diagram of another display panel according to some embodiments of the present disclosure.

FIG. 5 is a schematic diagram of yet another display panel according to some embodiments of the present disclosure, for example, as shown in FIG. 5, it illustrates that the first wire 21 includes only the first-type first wire 211. Different from FIG. 4, in FIG. 5, in addition to the first-type second wire 221 electrically connected to the corresponding first-type first wire 211, the second wire 22 further includes a second-type second wire 222 for transmitting the first common signal. For example, a number of the first-type second wire 221 may be the same as that of the first wire 21. That is, the number of the first-type second wire 221 is the same as that of the first-type first wire 211.

Figure 6:
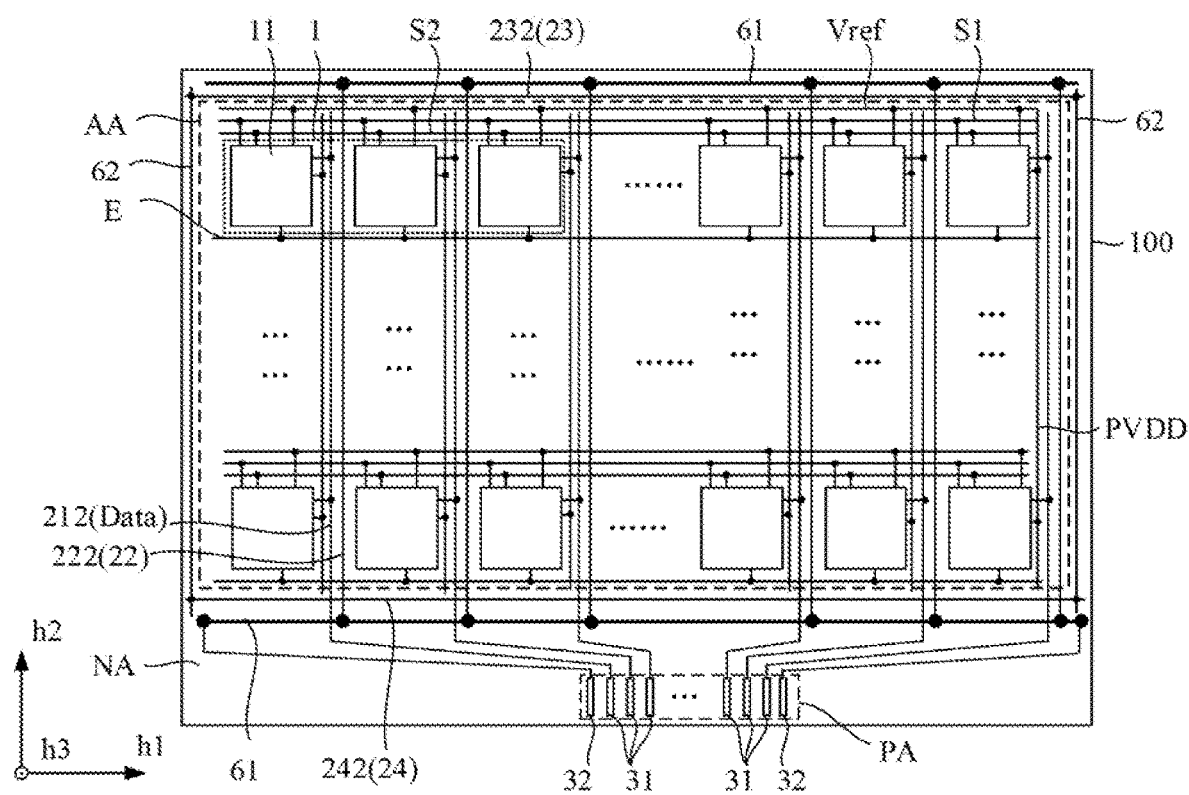
FIG. 6 is a schematic diagram of another display panel according to some embodiments of the present disclosure.

FIG. 6 is a schematic diagram of still another display panel according to some embodiments of the present disclosure, for example, as shown in FIG. 6, it illustrates that the first wire 21 includes only the second-type first wire 212 continuous between the third wire 23 and the fourth wire 24. In FIG. 6, the second wire 22 includes only the second-type second wire 222 for transmitting the first common signal. That is, each second wire 22 is not connected to the first wire 21.

During the manufacturing of the display panel, firstly, signal lines including the first wire 21 may be formed in the display panel. Then, it is detected whether the above first-type first wire 211 exists in the first wire 21. When the first-type first wire 211 exists, in some embodiments of the present disclosure, a repair step may be set in a manufacturing process of the display panel. In the repair step, the first sub wire 2111 in the first-type first wire 211 may be electrically connected to the second sub wire 2112 of the first-type first wire 211 through the first repair line 231, the first-type second wire 221, and the second repair line 241, to ensure that the pixel driving circuit 11 connected to the first sub wire 2111 and the second sub wire 2112 can receive required signals normally, which can prevent a situation where sub-pixels cannot be on or abnormally on and can improve the display quality of the display panel.

In addition to the first-type second wire 221 for repair, in some embodiments of the present disclosure, the second-type second wire 222 for transmitting the first common signal may also be arranged in the second wire 22. The arrangement of the second-type second wire 222 can increase transmission paths of the first common signal, which is conducive to reducing voltage drop loss of the first common signal during transmission and improving brightness uniformity of the display panel.

Based on the display panel according to some embodiments of the present disclosure, the second wire 22, the third wire 23, and the fourth wire 24 are arranged in the display panel, and when the first wire 21 includes the first-type first wire 211, the first-type second wire 221 may be arranged in the second wire 22, the first repair line 231 is arranged in the third wire 23, and the second repair line 241 is arranged in the fourth wire 24 to repair the first-type first wire 211. For example, the first sub wire 2111 and the second sub wire 2112 may be electrically connected through the first repair line 231, the first-type second wire 221, and the second repair line 241, which can ensure normal operation of the pixel driving circuit 11 connected to the first sub wire 2111 and the second sub wire 2112.

In some embodiments of the present disclosure, the second-type second wire 222 for transmitting the first common signal may also be arranged in the second wire 22, so as to reduce voltage drop loss of the first common signal during transmission and improve brightness uniformity of the display panel.

It is to be noted that the structure of the pixel driving circuit shown in FIG. 2 and the operation sequence of the pixel driving circuit shown in FIG. 3 are only illustrations. In some embodiments of the present disclosure, the pixel driving circuit may also be designed in other forms. For example, the pixel driving circuit 11 may be designed in a form of 2T1C including two thin film transistors and a storage capacitor, and the like. The specific structure of the pixel driving circuit 11 and the operation sequence thereof are not limited in the embodiments of the present disclosure.

For example, as shown in FIG. 1, FIG. 4, and FIG. 5, the first wire 21 includes the first-type first wire 211, the first sub wire 2111 is located on one side of the second sub wire 2112 close to the first repair line 231, and the second sub wire 2112 is located on one side of the first sub wire 2111 close to the second repair line 241.

In some embodiments of the present disclosure, in the non-display region NA, along a thickness direction h3 of the display panel 100, at least one of the first sub wire 2111 and the first-type second wire 221 overlaps with the first repair line 231; and/or at least one of the second sub wire 2112 and the first-type second wire 221 overlaps with the second repair line 241. For example, the thickness direction h3 of the display panel is perpendicular to both the first direction h1 and the second direction h2 described above.

FIG. 1, FIG. 4, and FIG. 5 are schematic diagrams illustrating that, along the thickness direction h3 of the display panel 100, both the first sub wire 2111 and the first-type second wire 221 are caused to overlap with the first repair line 231; and both the second sub wire 2112 and the first-type second wire 221 are caused to overlap with the second repair line 241. In some embodiments of the present disclosure, at least one of the first sub wire 2111 and the first-type second wire 221 is caused to overlap with the first repair line 231; and/or at least one of the second sub wire 2112 and the first-type second wire 221 is caused to overlap with the second repair line 241, which can more conveniently to electrically connect the first repair line 231 to the first sub wire 2111 and the first-type second wire 221 and more conveniently to electrically connect the second repair line 241 to the first-type second wire 221.

For example, as shown in FIG. 1, the non-display region NA further includes a pad region PA. The pad region PA includes a first pad 31 electrically connected to the first wire 21. In some embodiments, the first pad 31 may be bounded and connected to a driver chip (not shown) to receive a driving signal provided by the driver chip. In some embodiments of the present disclosure, the first sub wire 2111 and the second sub wire 2112 are electrically connected to a same first pad 31. With the arrangement, a number of the first pad 31 can be reduced, and when the first-type first wire 211 with a breakpoint is repaired, there is no need to additionally provide a repair pad electrically connected to the first-type second wire 211, which, on the one hand, can reduce a number of pads required, and on the other hand, is also conducive to reducing a requirement on the driver chip and reducing costs of the driver chip. For example, the first-type first wire 211 and the second-type first wire 212 may be electrically connected to different first pads 31.

As shown in FIG. 1, FIG. 4, FIG. 5, and FIG. 6, the non-display region NA further includes a first common signal bus 61, and the pad region PA further includes a second pad 32. In the non-display region NA, the second-type second wire 222 is electrically connected to the second pad 32 through the first common signal bus 61. For example, when the first common signal is any one of the first power supply voltage, the second power supply voltage, and the reference voltage, based on the arrangement according to some embodiments of the present disclosure, there is no need to electrically connect the second-type second wire 222 to a trace transmitting the above signal in the display region AA, which is conducive to preventing an increase in wiring complexity in the display region AA.

For example, the first common signal bus 61 may at least partially surround the display region AA. In FIG. 1, FIG. 4, FIG. 5, and FIG. 6, as an illustration, two sides of the display region AA along the second direction h2 are each provided with one first common signal bus 61.

For example, as shown in FIG. 1, FIG. 5, and FIG. 6, the second wire 22 includes second-type second wires 222. The arrangement of the second-type second wires 222 can increase transmission paths of the first common signal, which is beneficial to further reduce further reduce the voltage drop loss of the first common signal.

For example, as shown in FIG. 1, FIG. 4, and FIG. 5, the third wire 23 further includes a first function line 232 spaced apart from the first repair line 231, and the first function line 232 and the first repair line 231 are insulated from each other. The fourth wire 24 further includes a second function line 242 spaced apart from the second repair line 241, and the second function line 242 and the second repair line 241 are insulated from each other. In some embodiments, at least one of the first function line 232 and the second function line 242 transmits a second common signal. In some embodiments, the second common signal includes any one of the first power supply voltage, the second power supply voltage, and the reference voltage. The use of the above arrangement is beneficial to reduce voltage drop of the second common signal and improve the brightness uniformity of the display panel. Moreover, based on the arrangement, a space of the non-display region NA where the first repair line 231 and the second repair line 241 are located can also be fully utilized.

For example, as shown in FIG. 1, FIG. 4, and FIG. 5, the non-display region NA further includes a second common signal bus 62, and the first function line 232 and/or the second function line 242 are/is electrically connected to the second common signal bus 62.

In some embodiments, in the manufacturing process of the display panel, a longer third wire 23 and a longer fourth wire 2 may be formed firstly, and at least one of the third wire 23 and the fourth wire 24 is connected to the second common signal bus 62. After it is detected that the first wire 21 includes the first-type first wire 211, in some embodiments of the present disclosure, the third wire 23 may be cut to obtain the first repair line 231 and the first function line 232 that are insulated from each other. The first repair line 231 is disconnected from the above second common signal bus 62, and at least part of the first function line 232 remains connected to the above second common signal bus 62. Moreover, the first repair line 231 is connected to the first-type first wire 211 and the first-type second wire 221. That is, in some embodiments of the present disclosure, the first function line 232 and the first repair line 231 may be formed by a same process. Similarly, after it is detected that the first wire 21 includes the first-type first wire 211, in some embodiments of the present disclosure, the fourth wire 24 may be cut to obtain the second repair line 241 and the second function line 242 that are insulated from each other. The second repair line 241 is disconnected from the above second common signal bus 62, and at least part of the second function line 242 remains connected to the above second common signal bus 62. Moreover, the second repair line 241 is connected to the first-type first wire 211 and the first-type second wire 221. That is, in some embodiments of the present disclosure, the second function line 242 and the second repair line 241 may be formed by a same process.

FIG. 1, FIG. 4, FIG. 5, and FIG. 6 illustrate that two second common signal buses 62 are arranged on two opposite sides of the display region AA along the first direction h1. In FIG. 1, the first repair line 231 is located between the two first function lines 232, and the two first function lines 232 are both connected to the second common signal bus 62. The second repair line 241 is located between the two second function lines 242, and the two second function lines 242 are both connected to the second common signal bus 62.

When the second wire 22 includes first-type second wires 221, as shown in FIG. 4 and FIG. 5, the third wire 23 includes first repair lines 231, and the fourth wire 24 includes second repair lines 241. Different first repair lines 231 are insulated from each other, and different second repair lines 241 are insulated from each other. As shown in FIG. 4 and FIG. 5, along an extension direction of the third wire 23, the first function line 232 and the first repair line 231 are arranged alternately. Moreover, the two first function lines 232 arranged close to two ends of the third wire 23 are both connected to the second common signal bus 62, and the remaining first function lines 232 are floating. Along an extension direction of the fourth wire 24, the second function line 242 and the second repair line 241 are arranged alternately. Moreover, the two second function lines 242 arranged close to two ends of the fourth wire 24 are both connected to the second common signal bus 62, and the remaining second function lines 242 are floating. During the operation of the display panel 100, the floating first function line 232 and the floating second function line 242 may not receive electrical signals.

When it is detected that the first wire 21 does not include the first-type first wire 211, in some embodiments of the present disclosure, the third wire 23 and the fourth wire 24 may not be cut, the above first repair line is not formed in the third wire 23, and the above second repair line is not formed in the fourth wire 24. In this case, as shown in FIG. 6, the third wire 23 is the first function line 232, and the fourth wire 24 is the second function line 242. Two ends of the third wire 23 are both connected to the second common signal bus 62. Two ends of the fourth wire 24 are both connected to the second common signal bus 62.

In some embodiments of the present disclosure, with the arrangement of the first function line 232 transmitting the second common signal, voltage drop of the second common signal during the transmission can be reduced, which is beneficial to improve the brightness uniformity of the display panel. Moreover, in some embodiments of the present disclosure, both the first function line 232 and the first repair line 231 are obtained by cutting the third wire 23, and/or, the second function line 242 and the second repair line 241 are both obtained by cutting the fourth wire 24, which is conducive to improving process efficiency of the display panel.

Figure 7:
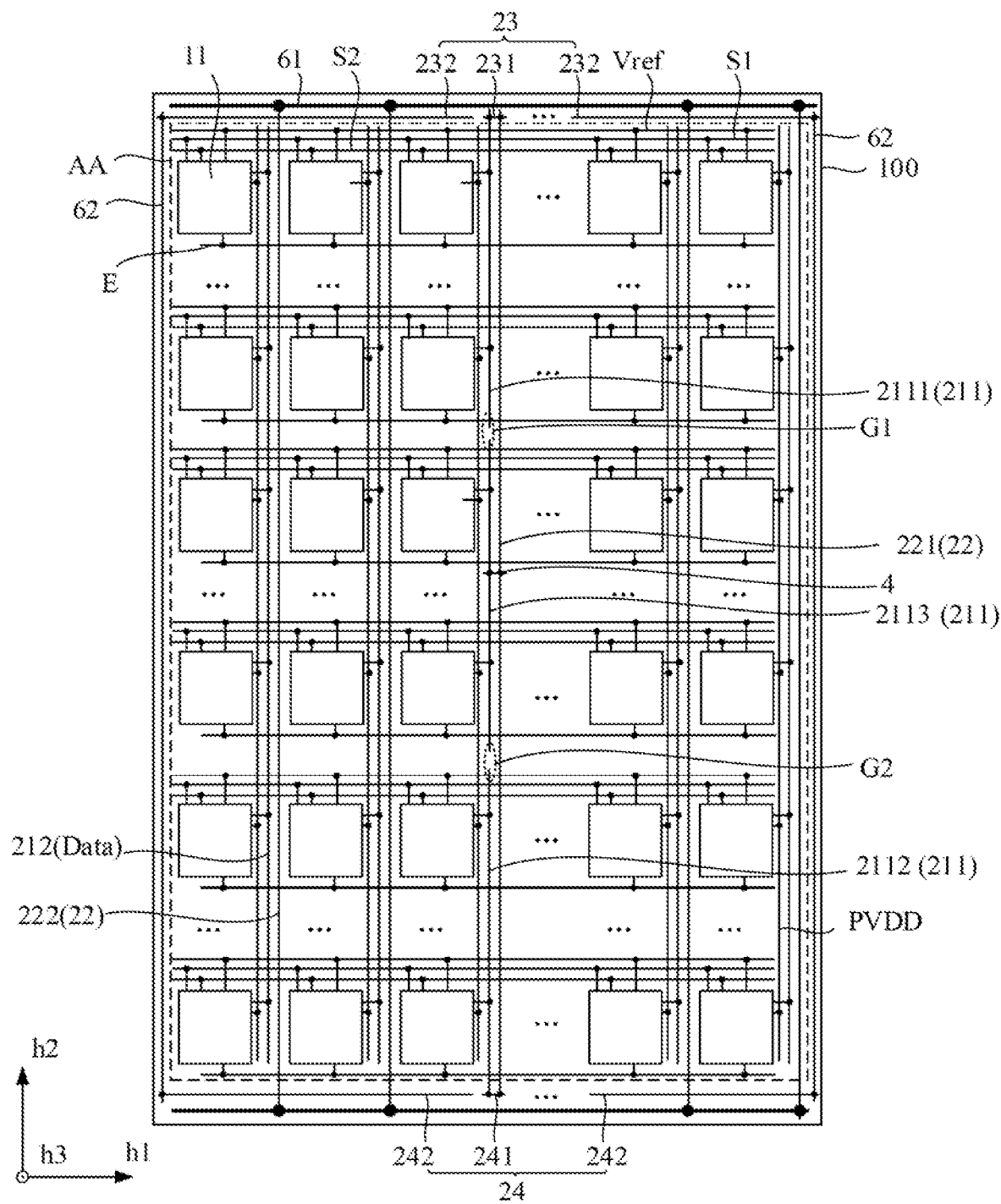
FIG. 7 is a schematic diagram of another display panel according to some embodiments of the present disclosure.

FIG. 7 is a schematic diagram of still another display panel according to some embodiments of the present disclosure. For example, as shown in FIG. 7, the first-type first wire 211 further includes a third sub wire 2113 located between the first sub wire 2111 and the second sub wire 2112, and the third sub wire 2113 is spaced apart from the first sub wire 2111 and the second sub wire 2112. For example, as shown in FIG. 7, the third sub wire 2113 and the first sub wire 2111 are spaced apart by a first gap G1, and the third sub wire 2113 and the second sub wire 2112 are spaced apart by a second gap G2. The first gap G1 and the second gap G2 may be breakpoints caused by process reasons.

As shown in FIG. 7, the display region AA further includes a third repair line 4, and the third repair line 4 is connected to the third sub wire 2113 and the second-type second wire 222. Based on the arrangement according to some embodiments of the present disclosure, the third sub wire 2113 can be electrically connected to the first sub wire 2111 and the second sub wire 2112 through the third repair line 4, which ensures normal operation of the pixel driving circuit 11 connected to the third sub wire 2113.

When the first wire 21 includes the first-type first wire 211 and the second-type first wire 212, for example, as shown in FIG. 1, a distance d1 between the first-type first wire 211 and the first-type second wire 221 electrically connected thereto is less than or equal to a minimum distance d2 between the first-type first wire 211 and any second-type second wire 222. That is, the first-type second wire 221 electrically connected to the first-type first wire 211 is the second wire 22 closest to the first-type first wire 211. With the arrangement, a signal transmission path in the first-type first wire 211 can be shortened, which is conducive to reducing voltage drop loss of a signal transmitted by the first wire 21 during transmission.

For example, as shown in FIG. 1, along a direction parallel to a plane where the display panel 100 is located, first wires 21 and second wires 22 are arranged alternately. That is, one second wire 22 is included between any two adjacent first wires 21, and one first wire 21 is included between any two adjacent second wires 22. With the arrangement, when any first wire 21 is disconnected, that is, when any first wire 21 is the above first-type first wire 211, the first wire may be electrically connected to the second wire 22 closest thereto.

Figure 8:
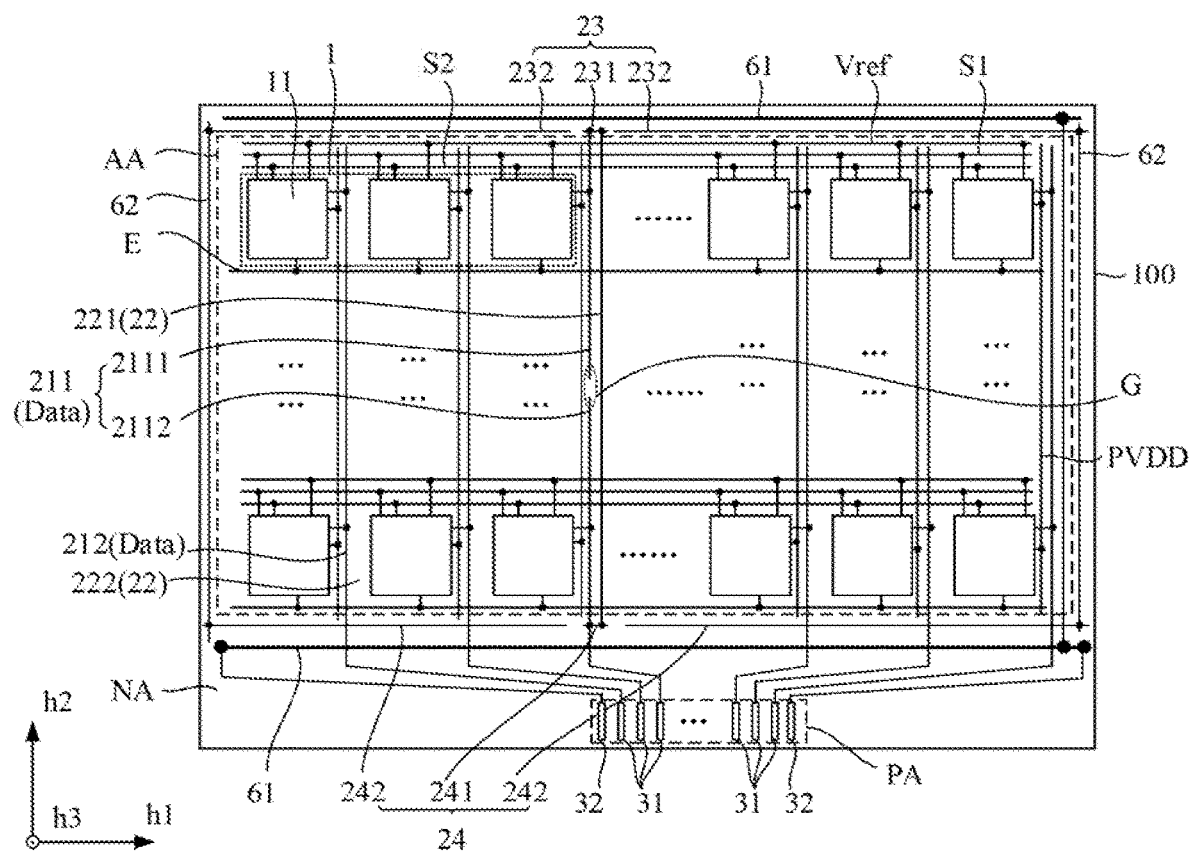
FIG. 8 is a schematic diagram of another display panel according to some embodiments of the present disclosure.

FIG. 8 is a schematic diagram of still another display panel according to some embodiments of the present disclosure. In some embodiments, as shown in FIG. 8, the display region AA includes pixel units 1, and the pixel units 1 include N sub-pixels, where N≥2 and N is an integer. N first wires 21 are included between two adjacent second wires 22. In FIG. 1, as an illustration, N=3. With the arrangement, a number of the second wire 22 in the display region AA can be reduced, which can also weaken the influence on an existing trace in the display region AA while ensuring that the disconnected first-type first wire 211 is repaired.

Figure 9:
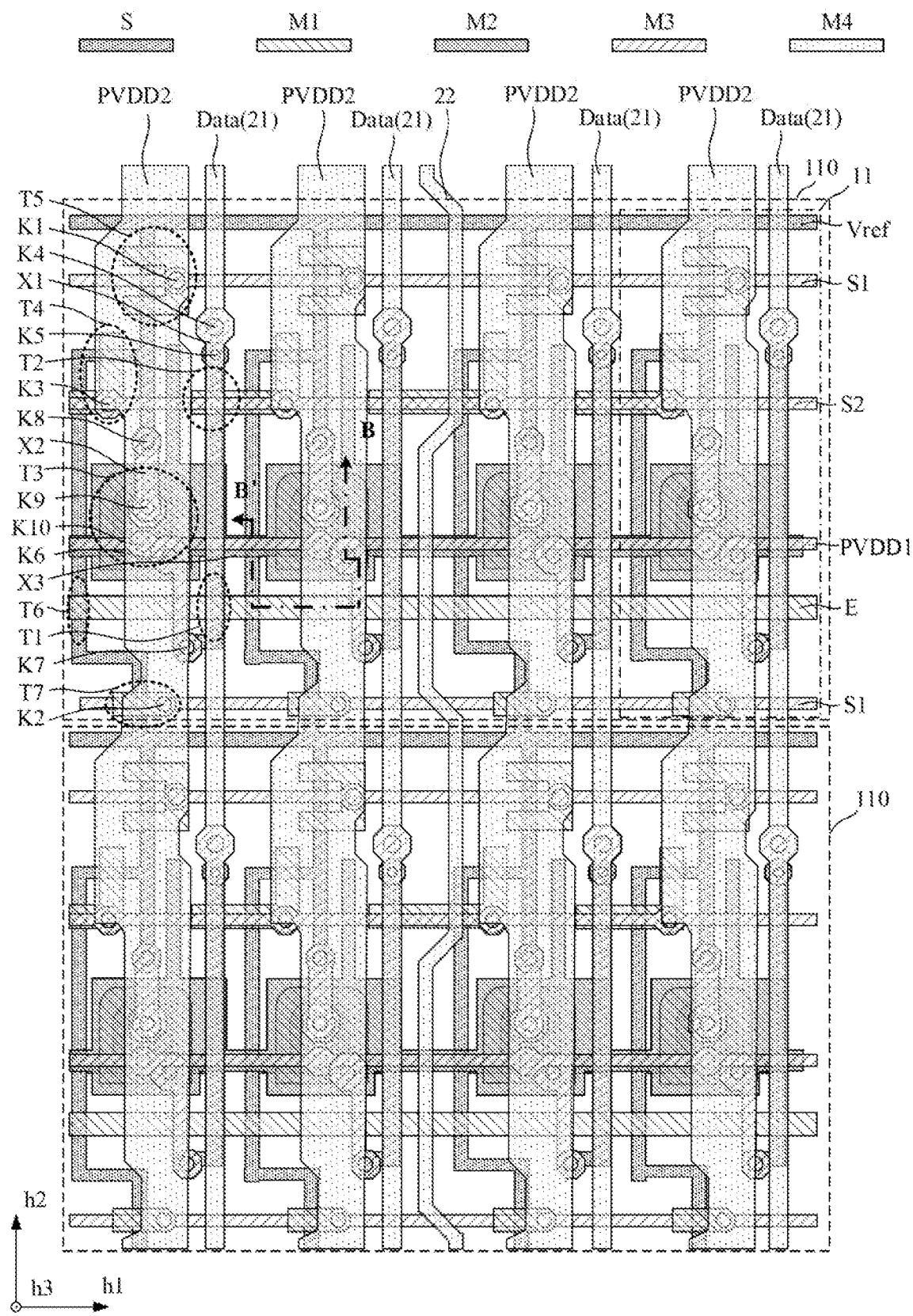
FIG. 9 is a schematic diagram of wiring of a display panel according to some embodiments of the present disclosure.
Figure 10:
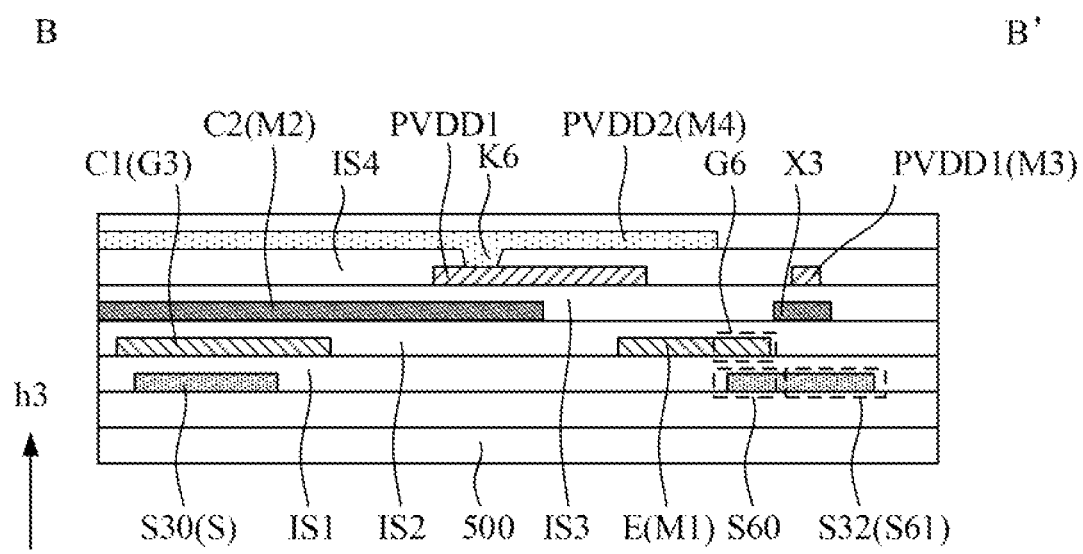
FIG. 10 is a schematic cross-sectional view along BB' in FIG. 9.

A film layer structure of the display panel according to some embodiments of the present disclosure will be described below with reference to FIG. 9 and FIG. 10. FIG. 9 is a schematic diagram of wiring of a display panel according to some embodiments of the present disclosure, and FIG. 10 is a schematic cross-sectional view along BB' in FIG. 9. In FIG. 9, two pixel driving circuit groups 110 arranged along the second direction h2 are illustrated, and four pixel driving circuits 11 arranged along the first direction h1 are illustrated in each pixel driving circuit group 110. Each pixel driving circuit 11 may have the circuit structure shown in FIG. 2.

As shown in FIG. 10, the display panel 100 includes a substrate 500, a semiconductor layer S, a first insulating layer IS1, a first metal layer M1, a second insulating layer IS2, a second metal layer M2, a third insulating layer IS3, a third metal layer M3, a fourth insulating layer IS4, and a fourth metal layer M4. The semiconductor layer S is located on one side of the substrate 500, the first insulating layer IS1 is located on one side of the semiconductor layer S away from the substrate 500, the first metal layer M1 is located on one side of the first insulating layer IS1 away from the semiconductor layer S, the second insulating layer IS2 is located on one side of the first metal layer M1 away from the semiconductor layer S, the second metal layer M2 is located on one side of the second insulating layer IS2 away from the first metal layer M1, the third insulating layer IS3 is located on one side of the second metal layer M2 away from the second insulating layer IS2, the third metal layer M3 is located on one side of the third insulating layer IS3 away from the second metal layer M2, the fourth insulating layer IS4 is located on one side of the third metal layer M3 away from the third insulating layer IS3, and the fourth metal layer M4 is located on one side of the fourth insulating layer IS4 away from the third metal layer M3.

Figure 11:
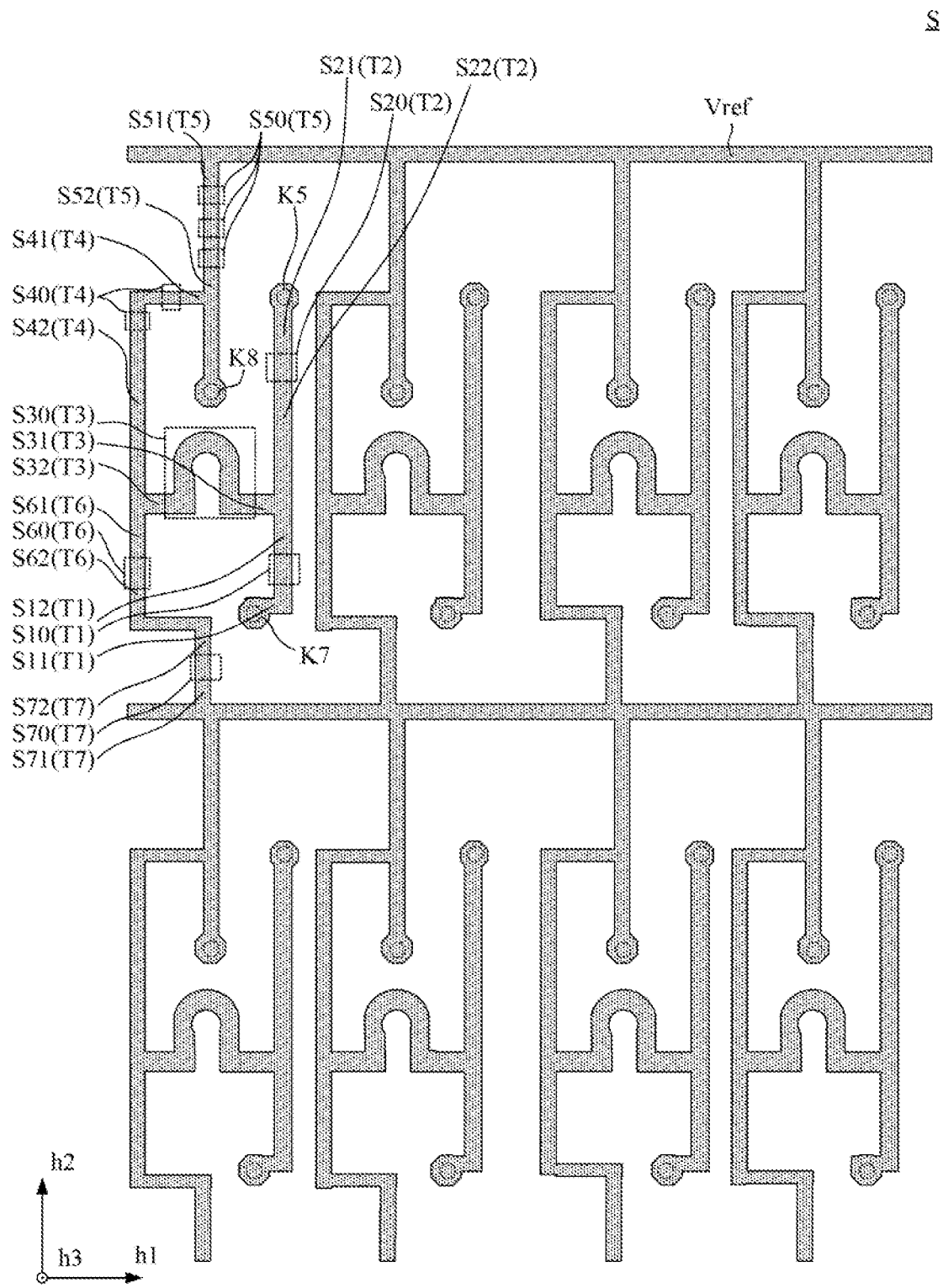
FIG. 11 is a schematic top view of a semiconductor layer according to some embodiments of the present disclosure.

FIG. 11 is a schematic top view of a semiconductor layer according to some embodiments of the present disclosure. Referring to FIG. 9, FIG. 10, and FIG. 11, the semiconductor layer S includes a first channel region S10, a first doped region S11 and a second doped region S12 located on two sides of the first channel region S10, a second channel region S20, a third doped region S21 and a fourth doped region S22 located on two sides of the second channel region S20, a third channel region S30, a fifth doped region S31 and a sixth doped region S32 located on two sides of the third channel region S30, a fourth channel region S40, a seventh doped region S41 and an eighth doped region S42 located on two sides of the fourth channel region S40, a fifth channel region S50, a ninth doped region S51 and a tenth doped region S52 located on two sides of the fifth channel region S50, a sixth channel region S60, an eleventh doped region S61 and a twelfth doped region S62 located on two sides of the sixth channel region S60, a seventh channel region S70, and a thirteenth doped region S71 and a fourteenth doped region S72 located on two sides of the seventh channel region S70. In the two doped regions located on the two sides of each channel region, one is a source region and the other is a drain region. The source region and the drain region are doped with impurities. The impurities include P-type impurities or N-type impurities. For example, the semiconductor layer S includes any one or more of low-temperature polysilicon, amorphous silicon, and an oxide semiconductor layer.

As shown in FIG. 9 and FIG. 11, the semiconductor layer S further includes the reference voltage signal line $V_{ref}$. For example, the reference voltage signal line $V_{ref}$ is connected to the ninth doped region S51 and the thirteenth doped region S71. With the arrangement, compared with the formation of the reference voltage signal line $V_{ref}$ with a metal layer, it is beneficial to reduce leakage currents of the fifth transistor T5 and the seventh transistor T7 that are electrically connected to a gate of the third transistor T3.

Figure 12:
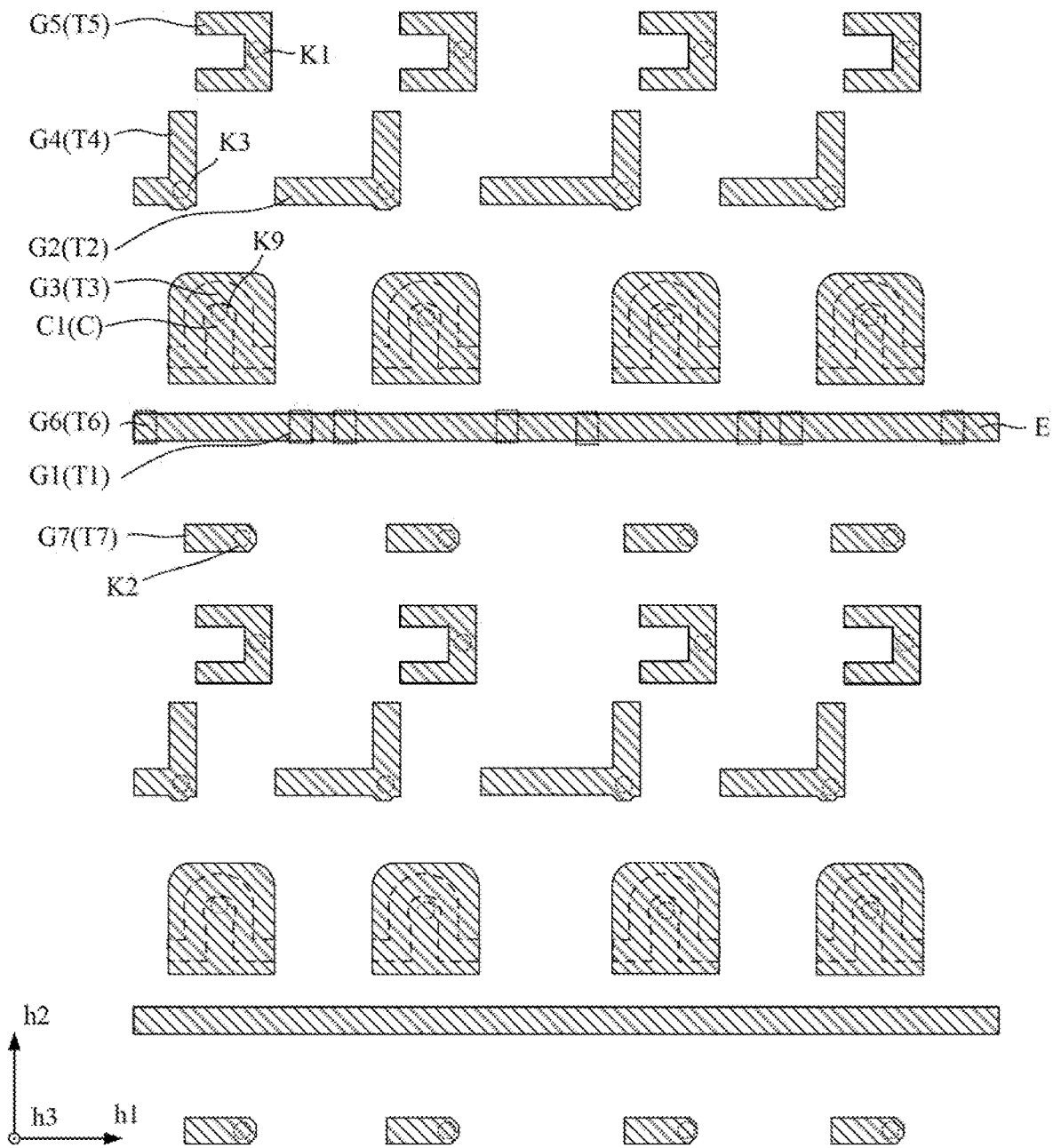
FIG. 12 is a schematic top view of a first metal layer according to some embodiments of the present disclosure.

FIG. 12 is a schematic top view of a first metal layer according to some embodiments of the present disclosure. As shown in FIG. 9 and FIG. 12, the first metal layer M1 includes the above light-emission control signal line E, a first polar plate C1 of the storage capacitor C, a gate G2 of the second transistor T2, a gate G4 of the fourth transistor T4, a gate G5 of the fifth transistor T5, and a gate G7 of the seventh transistor T7. The gate G2 of the second transistor T2 is connected to the gate G4 of the fourth transistor T4.

Referring to FIG. 11 and FIG. 12, along the thickness direction h3 of the display panel, the gate G2 of the second transistor T2 overlaps with the above second channel region S20. The gate G4 of the fourth transistor T4 overlaps with the above fourth channel region S40. The gate G5 of the fifth transistor T5 overlaps with the above fifth channel region S50. The gate G7 of the seventh transistor T7 overlaps with the above seventh channel region S70. Parts of the light-emission control signal line E overlapping with the first channel region S10 and the sixth channel region S60 correspondingly form the gate G1 of the first transistor T1 and the gate G6 of the sixth transistor T6 respectively. A part of the first polar plate C1 of the storage capacitor C overlapping with the third channel region S30 correspondingly forms the gate G3 of the third transistor T3.

Figure 13:
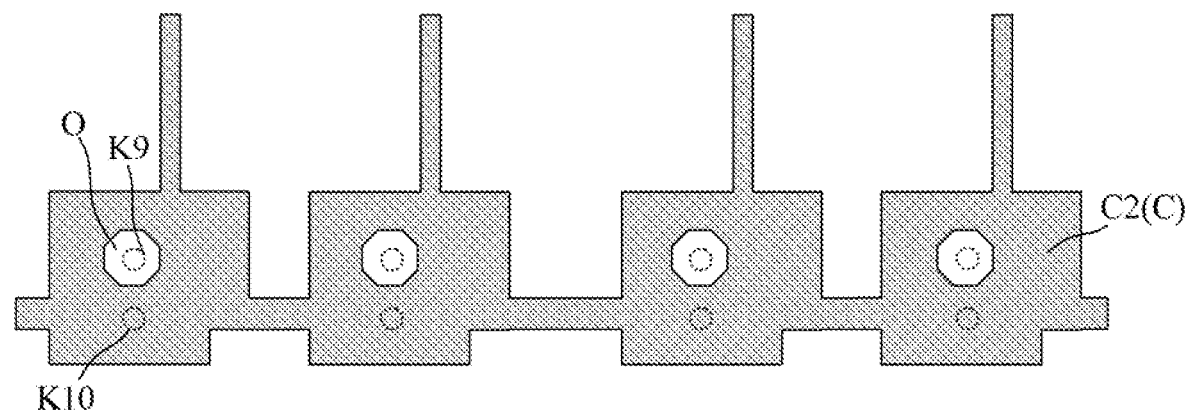
FIG. 13 is a schematic top view of a second metal layer according to some embodiments of the present disclosure.
Figure 13:
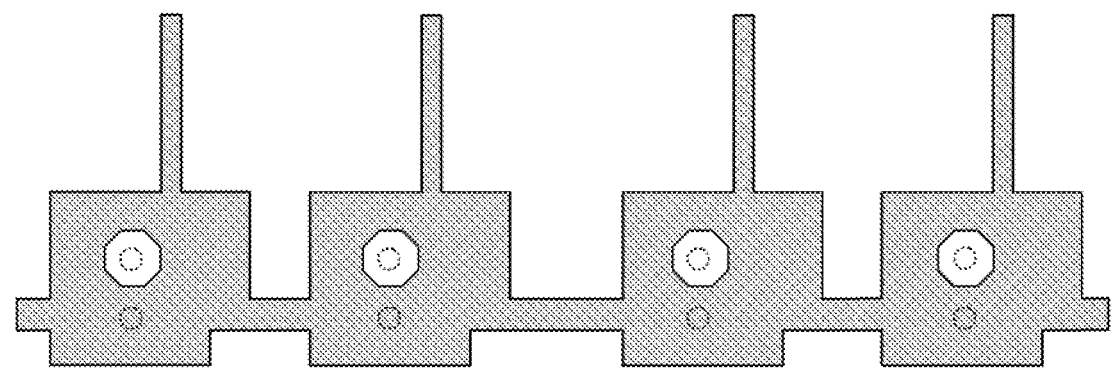
Figure 13:
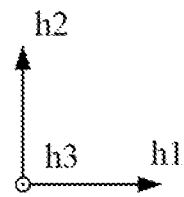

FIG. 13 is a schematic top view of a second metal layer according to some embodiments of the present disclosure.

Referring to FIG. 9 and FIG. 13, the second metal layer M2 includes a second polar plate C2 of the storage capacitor C.

Figure 14:
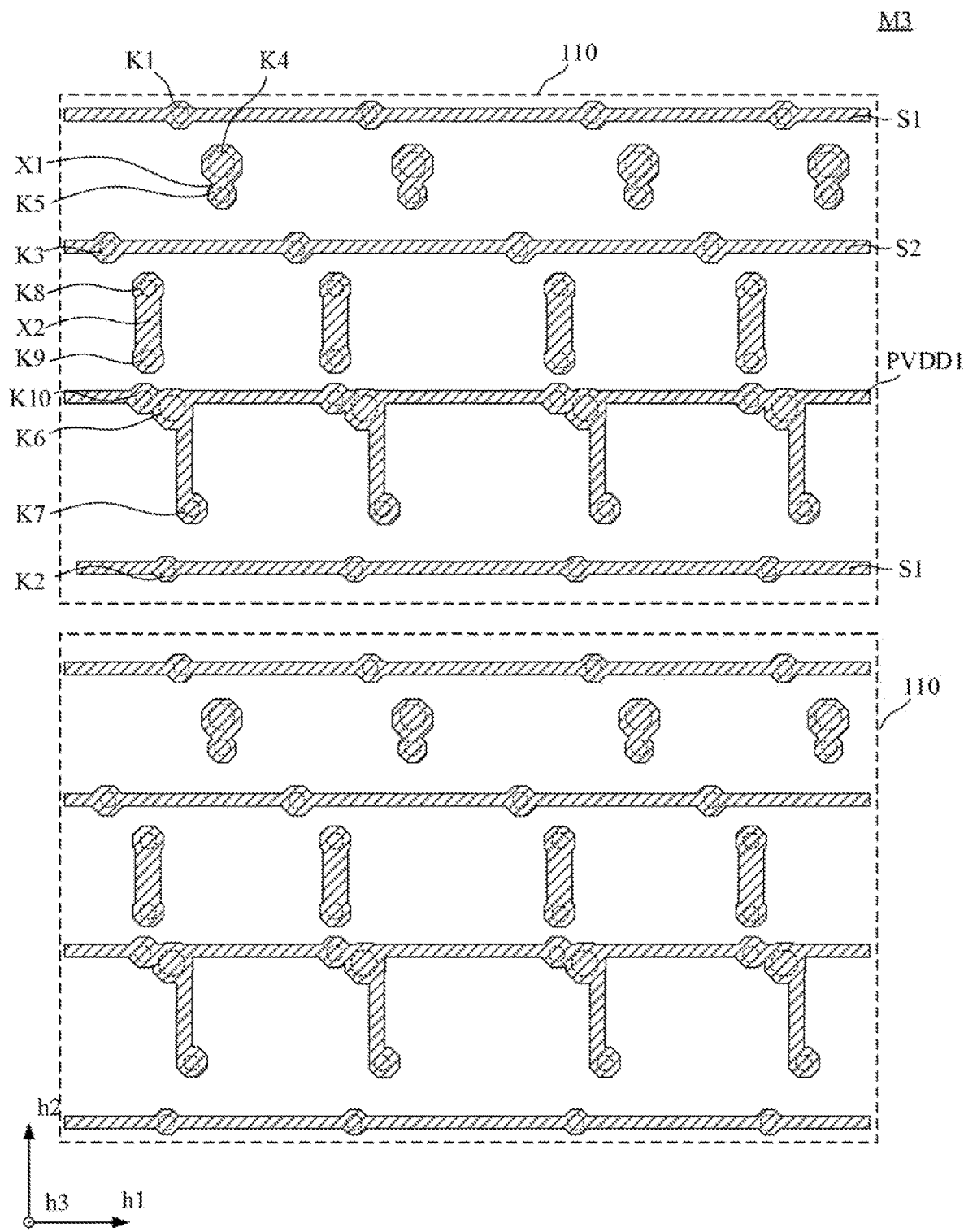
FIG. 14 is a schematic top view of a third metal layer according to some embodiments of the present disclosure.

FIG. 14 is a schematic top view of a third metal layer according to some embodiments of the present disclosure. Referring to FIG. 9 and FIG. 14, the third metal layer M3 includes a first scanning line S1, a second scanning line S2, and a first sub power supply voltage line PVDD1. The first sub power supply voltage line PVDD1 is configured to transmit the above first power supply voltage.

Referring to FIG. 9, FIG. 11, and FIG. 14, in the third metal layer M3, two first scanning lines S1 are provided corresponding to one pixel driving circuit group 110, one of the first scanning lines S1 overlaps with the fifth channel region S50 in the above semiconductor layer S in the thickness direction h3 of the display panel, and another gate of the fifth transistor is correspondingly formed in a region where the first scanning line S1 overlaps with the fifth channel region S50. Moreover, referring to FIG. 12, the first scanning line S1 is electrically connected to the gate G5 of the fifth transistor T5 located on the first metal layer M1 through a first via hole K1 running through the second insulating layer (not shown in FIG. 14) and the third insulating layer (not shown in FIG. 14). In FIG. 14 and other related drawings, positions including the first via hole K1 and other via holes are indicated by dotted lines.

Referring to FIG. 9, FIG. 12, and FIG. 14, another first scanning line S1 overlaps with the gate G7 of the seventh transistor T7 located on the first metal layer M1 in the thickness direction h3 of the display panel, and the first scanning line S1 is electrically connected to the gate G7 of the seventh transistor T7 located on the first metal layer M1 through a second via hole K2 running through the second insulating layer and the third insulating layer.

Referring to FIG. 12 and FIG. 14, the second scanning line S2 located on the third metal layer M3 is electrically connected to the gate G2 of the second transistor T2 and the gate G4 of the fourth transistor T4 that are located on the first metal layer M1 through a third via hole K3 running through the second insulating layer and the third insulating layer.

Figure 15:
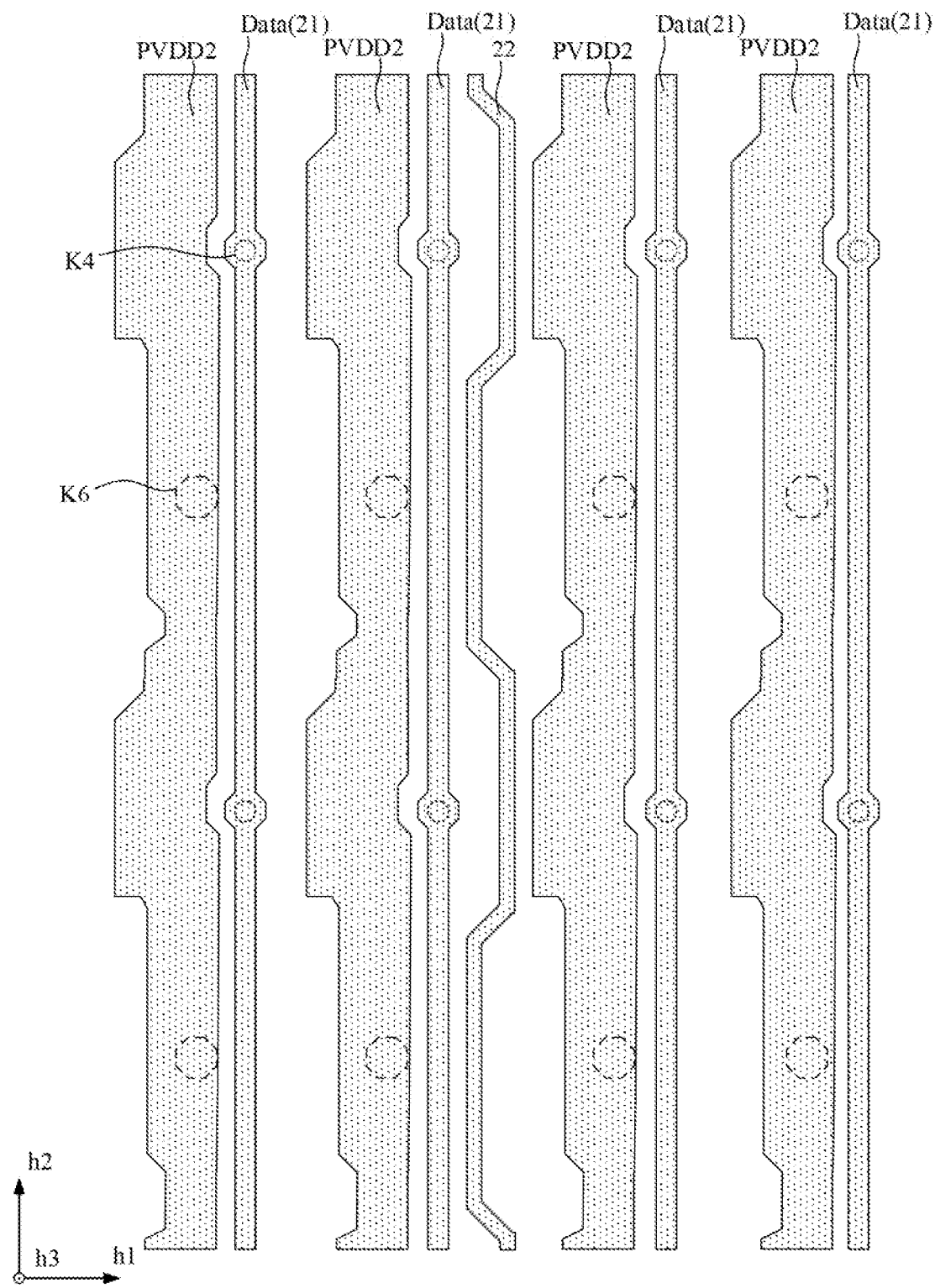
FIG. 15 is a schematic top view of a fourth metal layer according to some embodiments of the present disclosure.

Referring to FIG. 9 and FIG. 15, FIG. 15 is a schematic top view of a fourth metal layer according to some embodiments of the present disclosure. The fourth metal layer M4 includes a data line Data and a second sub power supply voltage line PVDD2. Extension directions of the second sub power supply voltage line PVDD2 and the above first sub power supply voltage line PVDD1 intersect. Moreover, the second sub power supply voltage line PVDD2 is configured to transmit the above first power supply voltage.

As shown in FIG. 9 and FIG. 14, the third metal layer M3 further includes a first connection portion X1. Referring to FIG. 15, the data line Data located on the fourth metal layer M4 is electrically connected to one end of the first connection portion X1 through a fourth via hole K4 running through the fourth insulating layer (not shown).

As shown in FIG. 9, FIG. 11, and FIG. 14, the other end of the first connection portion X1 is electrically connected to the third doped region S21 in the semiconductor layer S through a fifth via hole K5 running through the third insulating layer (not shown), the second insulating layer (not shown), and the first insulating layer (not shown), so as to transfer a data voltage to a source or drain of the second transistor T2.

Referring to FIG. 10 and FIG. 14, the second sub power supply voltage line PVDD2 located on the fourth metal layer M4 is electrically connected to the first sub power supply voltage line PVDD1 located on the third metal layer M3 through a sixth via hole K6 running through the fourth insulating layer (not shown in FIG. 14).

Referring to FIG. 11 and FIG. 13, the first sub power supply voltage line PVDD1 located on the third metal layer M3 is electrically connected to the first doped region S11 located in the semiconductor layer S through a seventh through hole K7 running through the third insulating layer (not shown), the second insulating layer (not shown), and the first insulating layer (not shown), so as to transfer the first power supply voltage to a source or drain of the first transistor T1.

As shown in FIG. 14, the third metal layer M3 further includes a second connection portion X2. Referring to FIG. 8 and FIG. 14, one end of the second connection portion X2 is electrically connected to the seventh doped region S41 and the tenth doped region S52 that are located in the semiconductor layer S through an eighth via hole K8 running through the third insulating layer (not shown), the second insulating layer (not shown), and the first insulating layer (not shown).

Referring to FIG. 12 and FIG. 14, the other end of the second connection portion X2 is electrically connected to the first polar plate C1 of the capacitor C located on the first metal layer M1 through a ninth via hole K9 running through the third insulating layer, the second metal layer, and the second insulating layer. A part of the first polar plate C1 overlapping with the above third channel region S30 is multiplexed as the gate G3 of the third transistor T3.

Referring to FIG. 13, the second polar plate C2 of the capacitor C located on the second metal layer M2 includes an opening O, and along the thickness direction h3 of the display panel, the above ninth via hole K9 overlaps with the opening O.

For example, an area of the opening O is greater than or equal to that of the ninth via hole K9. FIG. 13 illustrates that the area of the opening O is greater than that of the ninth via hole K9. An orthographic projection of the ninth via hole K9 on a plane of the substrate is located in the opening O.

Referring to FIG. 9, FIG. 13, and FIG. 14, the first sub power supply voltage line PVDD1 located on the third metal layer M3 is electrically connected to the second polar plate C2 of the capacitor C located on the second metal layer M2 through a tenth via hole K10 running through the third insulating layer (not shown).

In some embodiments of the present disclosure, the first wire 21 and the second wire 22 may be arranged on a same layer, to simplify the manufacturing process of the display panel.

For example, when the data line Data includes the above first wire 21, as shown in FIG. 9 and FIG. 15, the fourth metal layer M4 further includes the second wire 22 arranged on the same layer as the first wire 21.

For example, as shown in FIG. 1, FIG. 9, and FIG. 15, along the thickness direction h3 of the display panel, the first wire 21 does not overlap with the second wire 22.

Figure 16:
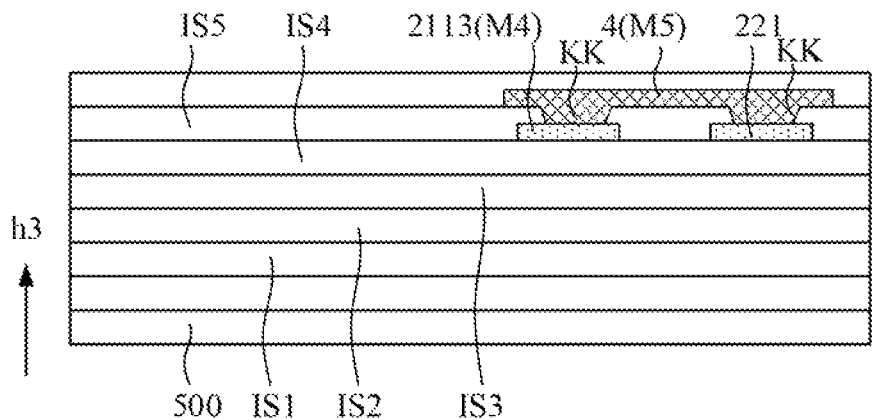
FIG. 16 is a schematic cross-sectional view of another display panel according to some embodiments of the present disclosure.

In some embodiments, referring to FIG. 7 and FIG. 16, FIG. 16 is a schematic cross-sectional view of still another display panel according to some embodiments of the present disclosure. When the display region AA includes the third repair line 4, the third repair line 4 is located on one side of the first wire 21 away from the substrate 500. FIG. 16 is a schematic diagram illustrating that the third sub wire 2113 and the first-type second wire 221 are arranged on the fourth metal layer M4 and the third repair line 4 is arranged on a fifth metal layer M5. The fifth metal layer M5 is located on one side of the fourth metal layer M4 away from the substrate 500, a fifth insulating layer IS5 is included between the fourth metal layer M4 and the fifth metal layer M5, and the third repair line 4 is electrically connected to the third sub line 2113 and the first-type second wire 221 respectively through two through holes KK running through the fifth insulating layer IS5. The arrangement is beneficial to reduce the influence on the existing trace in the display region AA.

Figure 17:
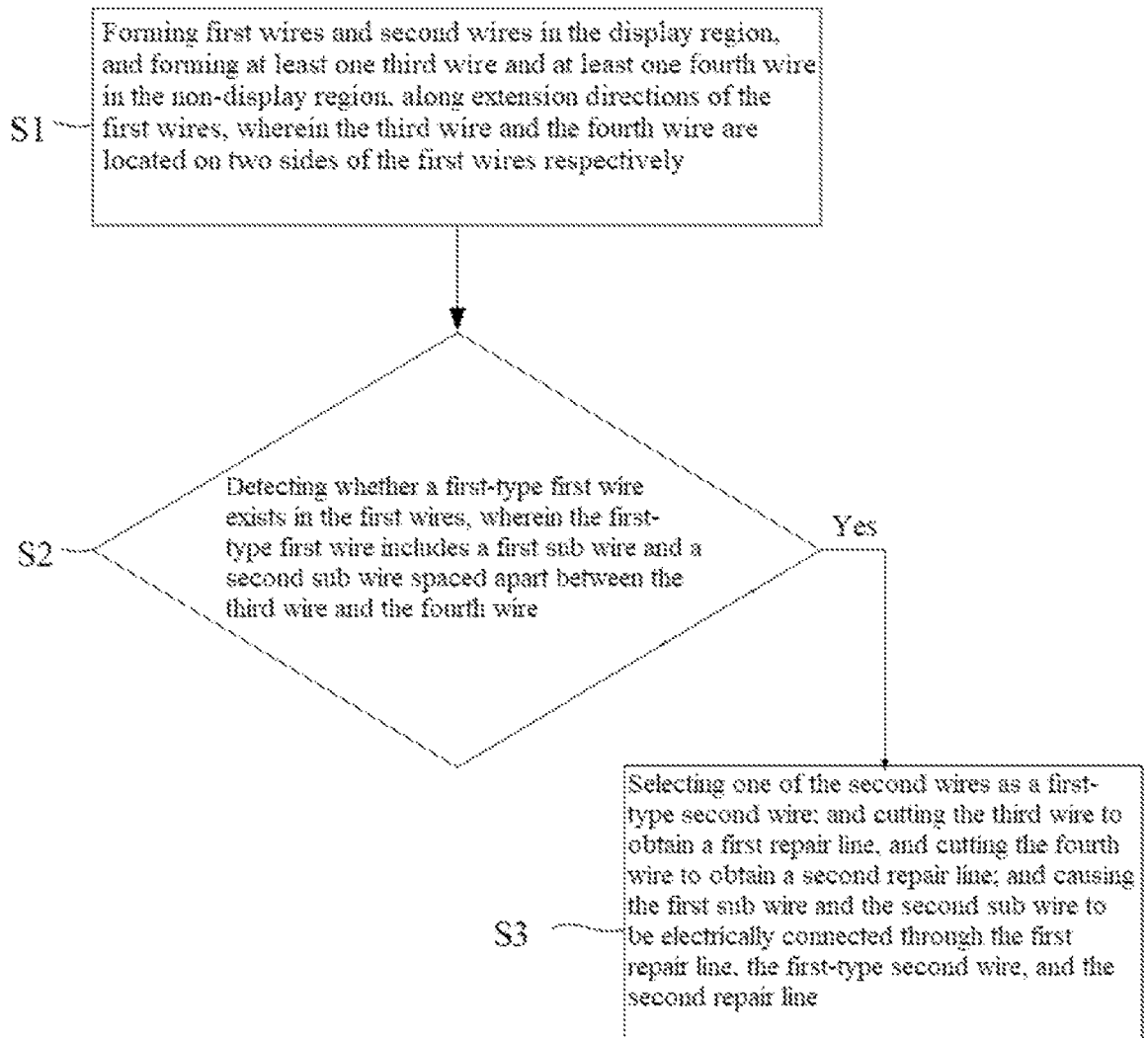
FIG. 17 is a schematic diagram of a manufacturing method for a display panel according to some embodiments of the present disclosure.

In some embodiments of the present disclosure, it provides a manufacturing method of a display panel. Referring to FIG. 1 and FIG. 17, FIG. 17 is a schematic diagram of a manufacturing method for a display panel according to some embodiments of the present disclosure. The display panel includes a display region AA and a non-display region NA. The manufacturing method includes the following steps.

In step S1, a pixel driving circuit 11, a first scanning line S1, a second scanning line S2, a light-emission control signal line E, a first power supply voltage line PVDD, a second power supply voltage line, a reference voltage signal line $V_{ref}$, a data line Data, and second wires 22 are formed in the display region AA. At least one of the first scanning line S1, the second scanning line S2, the light-emission control signal line E, and the data line Data includes a first wire 21. At least one third wire 23 and at least one fourth wire 24 are formed in the non-display region NA, and along an extension direction of the first wire 21, the third wire 23 and the fourth wire 24 are located on two sides of the first wire 21 respectively.

In step S2, it is detected whether a first-type first wire 211 exists in the first wire 21, the first-type first wire 211 including a first sub wire 2111 and a second sub wire 2112 spaced apart between the third wire 23 and the fourth wire 24. If yes, that is, if the first wire 21 includes the first-type first wire 211, step S3 is performed. In some embodiments, a detection method includes providing corresponding electrical signals to the signal lines including the first wire 21 in the display panel 100, and detecting whether there are sub-pixels that cannot be normally on in the display region. If yes, it indicates that the wire 21 connected to such sub-pixels is the first-type first wire 211.

In step S3, one second wire 22 is selected as a first-type second wire 221; the third wire 23 is cut to obtain a first repair line 231, and the fourth wire 24 is cut to obtain a second repair line 241; and the first sub wire 2111 and the second sub wire 2112 are electrically connected through the first repair line 231, the first-type second wire 221, and the second repair line 241. In some embodiments of the present disclosure, the first repair line 231, the first-type first wire 211, and the first-type second wire 221 may be electrically connected by soldering. In some embodiments, the above cutting process includes laser cutting, and the soldering process includes laser soldering.

Based on the manufacturing method for the display panel according to some embodiments of the present disclosure, the second wire 22, the third wire 23, and the fourth wire 24 are arranged in the display panel, and when it is detected that the first wire 21 includes the first-type first wire 211, the first-type second wire 221 may be arranged in the second wire 22, the third wire 23 is cut to obtain the first repair line 231, the fourth wire 24 is cut to obtain the second repair line 241, and the first sub wire 2111 and the second sub wire 2112 may be electrically connected through the first repair line 231, the first-type second wire 221, and the second repair line 241, which can ensure normal operation of the pixel driving circuit 11 connected to the first sub wire 2111 and the second sub wire 2112.

When the display panel includes second wires 22, for example, the first-type second wire 221 electrically connected to the first-type first wire 211 is the second wire 22 closest to the first-type first wire 211. With this arrangement, when the first sub wire 2111 is electrically connected to the second sub wire 2112 through the first repair line 231 and the first-type second wire 221, that is, when the disconnection of the first-type first wire 211 is repaired through the first-type second wire 221, a signal transmission path in the first-type first wire 211 can be shortened, which is conducive to reducing voltage drop loss of a signal transmitted by the first-type first wire 211.

For example, the method of forming first wires 21 and second wires 22 in the display region AA, cutting the third wire 23 to obtain a first repair line 231, and cutting the fourth wire 24 to obtain a second repair line 241 includes:
  in the non-display region NA, along a direction perpendicular to a plane where the display panel is located, causing the first repair line 231 to overlap with at least one of the first wire 21 and the second wire 22; and/or causing the second repair line 241 to overlap with at least one of the first wire 21 and the second wire 22.

In some embodiments, as shown in FIG. 1, the manufacturing method according to some embodiments of the present disclosure further includes: forming a first common signal bus 61 in the non-display region NA; and taking second wires 22 other than the first-type second wire 221 as a second-type second wire 222, and causing the second-type second wire 222 to be electrically connected to the first common signal bus 61. The arrangement can reduce voltage drop loss of the first common signal during transmission and improve brightness uniformity of the display panel.

In some embodiments, as shown in FIG. 1, the above manufacturing method further includes: forming a second common signal bus 62 in the non-display region NA, the second common signal bus 62 being configured to transmit a second common signal;
  cutting the third wire 23 to obtain a first function line 232, and cutting the fourth wire 24 to obtain a second function line 242; and
  causing both the first function line 232 and the second function line 242 to be electrically connected to the second common signal bus 62 and causing both the first repair line 231 and the second repair line 241 to be insulated from the second common signal bus 62.

The arrangement of the first function line 232 and the second function line 242 is beneficial to increase transmission paths of the second common signal, reduce voltage drop of the second common signal, and improve the display uniformity of the display panel. Moreover, in some embodiments of the present disclosure, the first function line 232 is obtained by cutting the third wire 23, and the second function line 242 is obtained by cutting the fourth wire 24, which can simplify manufacturing processes of the first repair line 231, the first function line 232, the second repair line 241, and the second function line 242, and improve process efficiency.

For example, when it is detected that the first wire 21 does not include the first-type first wire 211, in some embodiments of the present disclosure, the third wire 23 and the fourth wire 24 may not be cut, the above first repair line is not formed in the third wire 23, and the above second repair line is not formed in the fourth wire 24. In this case, as shown in FIG. 6, the third wire 23 is the first function line 232, and the fourth wire 24 is the second function line 242. As shown in FIG. 6, two ends of the third wire 23 are both connected to the second common signal bus 62. Two ends of the fourth wire 24 are both connected to the second common signal bus 62.

Figure 18:
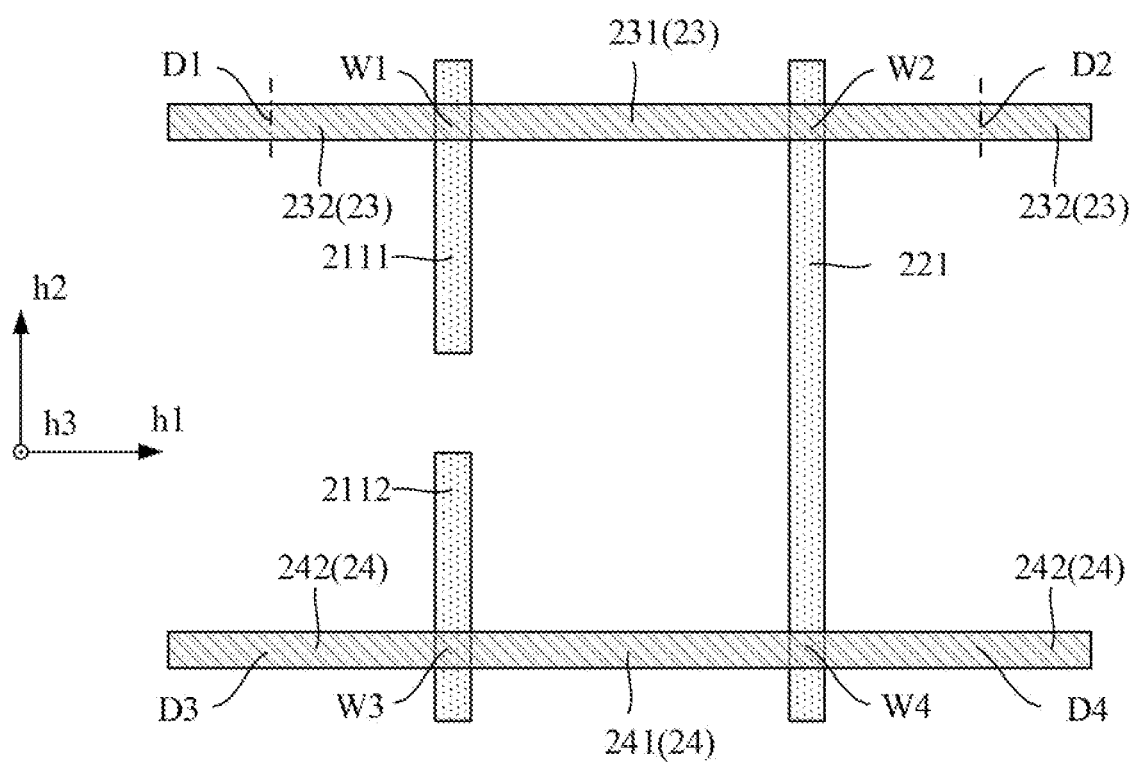
FIG. 18 is a schematic diagram of a position relationship among a first-type first wire, a first-type second wire, a third wire, and a fourth wire according to some embodiments of the present disclosure.

FIG. 18 is a schematic diagram of a position relationship among a first-type first wire, a first-type second wire, a third wire, and a fourth wire according to some embodiments of the present disclosure. As shown in FIG. 18, the method of cutting the third wire 23 to obtain a first repair line 231 includes:

determining, in the third wire 23, a first connection position W1 electrically connected to the first sub wire 2111 and a second connection position W2 electrically connected to the first-type second wire 221. For example, the first connection position W1 may be a position where the third wire 23 overlaps with the first sub wire 2111 along the thickness direction h3 of the display panel. The second connection position W1 may be a position where the third wire 23 overlaps with the first-type second wire 221 along the thickness direction h3 of the display panel. A first cutting point D1 and a second cutting point D2 are determined in the third wire 23, and both the first connection position W1 and the second connection position W2 are located between the first cutting point D1 and the second cutting point D2. Then, the third wire 23 is cut at the first cutting point D1 and the second cutting point D2 to obtain the first repair line 231.

For example, one side of the first cutting point D1 away from the first repair line 231 and/or one side of the second cutting point D2 away from the first repair line 231 are/is the above first function line 232.

Referring to FIG. 17, a method of cutting the fourth wire 24 to obtain a second repair line 241 is disclosed In some embodiments, the method includes determining, in the fourth wire 24, a third connection position W3 electrically connected to the second sub wire 2112 and a fourth connection position W4 electrically connected to the first-type second wire 221. For example, the third connection position W3 may be a position where the fourth wire 24 overlaps with the second sub wire 2112 along the thickness direction h3 of the display panel. The fourth connection position W4 may be a position where the fourth wire 24 overlaps with the first-type second wire 221 along the thickness direction h3 of the display panel. A third cutting point D3 and a fourth cutting point D4 are determined in the fourth wire 24, and both the third connection position W3 and the fourth connection position W4 are located between the third cutting point D3 and the fourth cutting point D4. Then, the fourth wire 24 is cut at the third cutting point D3 and the fourth cutting point D4 to obtain the second repair line 241.

For example, one side of the third cutting point D3 away from the second repair line 241 and/or one side of the fourth cutting point D4 away from the second repair line 241 are/is the above second function line 242.

Figure 19:
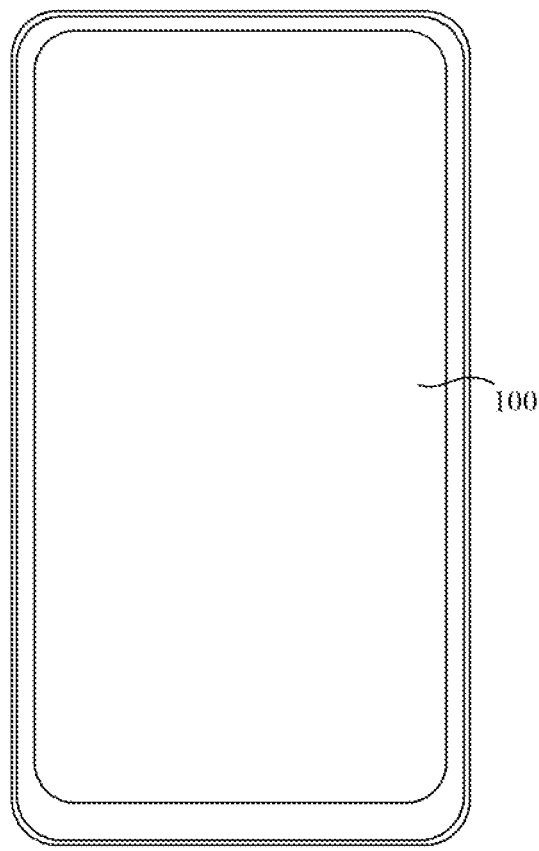
FIG. 19 is a schematic diagram of a display device according to some embodiments of the present disclosure.

In some embodiments of the present disclosure, it provides a display device. As shown in FIG. 19, it is a schematic diagram of a display device according to some embodiments of the present disclosure. The display device includes the above display panel 100. The specific structure of the display panel 100 has been described in detail in the above embodiments. Details are not described herein again. Certainly, the display device shown in FIG. 19 is only a schematic illustration, and the display device may be any electronic device with a display function such as a mobile phone, a tablet computer, a notebook computer, an e-book, or a television.

The above are only preferred embodiments of the present disclosure and are not intended to limit the present disclosure. Any modifications, equivalent replacements, improvements, and the like made within the spirit and the principle of the present disclosure are intended to be included within the protection scope of the present disclosure.

What is claimed is:

1. A display panel, comprising:
   a display region;
   a non-display region;
   first wires and second wires located in the display region;
   at least one third wire and at least one fourth wire located in the non-display region, wherein along extension directions of the first wires, the third wire and the fourth wire are located on two sides of the first wires, respectively;
   wherein the first wires comprise a first-type first wire, and the first-type first wire comprises a first sub wire and a second sub wire spaced apart between one of the at least one third wire and one of the at least one fourth wire; the second wires comprise a first-type second wire; the at least one third wire comprises a first repair line; the at least one fourth wire comprises a second repair line; and the first sub wire and the second sub wire are electrically connected to each other through the second repair line, the first repair line and the first-type second wire;
   and/or
   wherein the first wires comprise a second-type first wire, the second-type first wire is continuous between one of the at least one third wire and one of the at least one the fourth wire, wherein the second wires comprises a second-type second wire, and the second-type second wire transmits a first common signal.

2. The display panel according to claim 1, wherein the first wires comprise the first-type first wire; and
   in the non-display region, along a thickness direction of the display panel, at least one of the first-type first wire or the first-type second wire overlaps with the first repair line; and/or
   at least one of the first-type first wire or the first-type second wire overlaps with the second repair line.

3. The display panel according to claim 1, wherein the first wires comprise the first-type first wire;
   the non-display region further comprises a pad region, wherein the pad region is provided with first pads electrically connected to the first wires; and
   the first sub wire and the second sub wire are electrically connected to a same one of the first pads.

4. The display panel according to claim 1, wherein the first wires comprise the first-type first wire;
   the at least one third wire further comprises a first function line spaced apart from the first repair line, and the at least one fourth wire further comprises a second function line spaced apart from the second repair line; and
   at least one of the first function line or the second function line transmits a second common signal.

5. The display panel according to claim 1, wherein the first wires comprise the first-type first wire;
   the first-type first wire further comprises a third sub wire located between the first sub wire and the second sub wire, wherein the third sub wire is spaced apart from the first sub wire and the second sub wire; and
   wherein the display region is further provided with a third repair line, and the third sub wire is electrically connected to the second sub wire through the third repair line, the first-type second wire, and the second repair line.

6. The display panel according to claim 5, further comprising a substrate, wherein the third repair line is located on one side of the first wires away from the substrate.

7. The display panel according to claim 1, wherein
the first wires comprise the second-type first wire;
the non-display region further comprises a pad region, wherein the pad region is provided with a first pad and a second pad, and the first pad is electrically connected to the second-type first wire; and
the non-display region further comprises a first common signal bus, wherein in the non-display region, the second-type second wire is electrically connected to the second pad through the first common signal bus.

8. The display panel according to claim 7, wherein the second wires comprise the second-type second wire.

9. The display panel according to claim 1, wherein
the first wires comprise the first-type first wire and the second-type first wire;
a distance between the first-type first wire and the first-type second wire electrically connected to it is less than or equal to a minimum distance between the first-type first wire and the second-type second wire.

10. The display panel according to claim 1, wherein the first wires and the second wires are arranged on a same layer.

11. The display panel according to claim 1, wherein along a thickness direction of the display panel, the first wires do not overlap with the second wires.

12. The display panel according to claim 1, wherein
the display region further comprises pixel units, the pixel units comprise N sub-pixels, N≥2, where N is an integer; and N first wires are provided between two adjacent second wires; or
along a direction parallel to a plane where the display panel is located, the first wires and the second wires are arranged alternately.

13. A method for manufacturing a display panel comprising a display region and a non-display region, the method comprising:
forming first wires and second wires in the display region;
forming at least one third wire and at least one fourth wire in the non-display region, the third wire and the fourth wire being located on two sides of the first wires respectively along extension directions of the first wires; and
detecting whether the first wires comprise a first-type first wire, the first-type first wire comprising a first sub wire and a second sub wire spaced apart between one of the at least one third wire and one of the at least one fourth wire; and
when the first wires comprise the first-type first wire:
selecting one of the second wires as a first-type second wire; and cutting the third wire to obtain a first repair line, and cutting the at least one fourth wire to obtain a second repair line; and
causing the first sub wire and the second sub wire to be electrically connected to each other through the first repair line, the first-type second wire, and the second repair line.

14. The method according to claim 13, wherein the first-type second wire is one of the second wires that is closest to the first-type first wire.

15. The method according to claim 13, wherein forming first wires and second wires in the display region, and cutting the at least one third wire to obtain a first repair line, and cutting the at least one fourth wire to obtain a second repair line comprises:

causing the first repair line to overlap with at least one of the first wires or the second wires in the non-display region, along a direction perpendicular to a plane where the display panel is located; and/or
causing the second repair line to overlap with at least one of the first wires or the second wires.

16. The manufacturing method according to claim 13, further comprising:
forming a first common signal bus in the non-display region; and
taking second wires other than the first-type second wire as a second-type second wire, and
causing the second-type second wire to be electrically connected to the first common signal bus.

17. The manufacturing method according to claim 13, further comprising:
forming a second common signal bus in the non-display region;
cutting the at least one third wire to obtain a first function line;
cutting the at least one fourth wire to obtain a second function line; and
causing both the first function line and the second function line to be electrically connected to the second common signal bus, and causing both the first repair line and the second repair line to be insulated from the second common signal bus.

18. The method according to claim 13,
wherein cutting the third wire to obtain a first repair line comprises:
determining, in the at least one third wire, a first connection position electrically connected to the first sub wire and a second connection position electrically connected to the first-type second wire; and
determining a first cutting point and a second cutting point in the at least one third wire, both the first connection position and the second connection position being located between the first cutting point and the second cutting point;
cutting the third wire at the first cutting point and the second cutting point to obtain the first repair line,
wherein cutting the fourth wire to obtain a second repair line comprises:
determining, in the at least one fourth wire, a third connection position electrically connected to the second sub wire and a fourth connection position electrically connected to the first-type second wire;
determining a third cutting point and a fourth cutting point in the at least one fourth wire, both the third connection position and the fourth connection position being located between the third cutting point and the fourth cutting point; and
cutting the at least one fourth wire at the third cutting point and the fourth cutting point to obtain the second repair line.

19. A display device, comprising:
a display panel comprising:
a display region;
a non-display region;
first wires and second wires located in the display region;
at least one third wire and at least one fourth wire located in the non-display region, wherein along extension directions of the first wires, the third wire and the fourth wire are located on two sides of the first wires, respectively;
wherein the first wires comprise a first-type first wire, and the first-type first wire comprises a first sub wire and a second sub wire spaced apart between one of the at least one third wire and one of the at least one fourth wire; the second wires comprise a first-type second wire; the at least one third wire comprises a first repair line; the at least one fourth wire comprises a second repair line; and the first sub wire and the second sub wire are electrically connected to each other through the second repair line, the first repair line and the first-type second wire;

and/or wherein the first wires comprise a second-type first wire, the second-type first wire is continuous between one of the at least one third wire and one of the at least one the fourth wire, and wherein the second wires comprise a second-type second wire, and the second-type second wire transmits a first common signal.

\* \* \* \* \*